(12) United States Patent
Nishimura et al.

(10) Patent No.: US 7,682,517 B2
(45) Date of Patent: *Mar. 23, 2010

(54) METHOD OF PROCESSING SUBSTRATE, AND METHOD OF AND PROGRAM FOR MANUFACTURING ELECTRONIC DEVICE

(75) Inventors: Eiichi Nishimura, Nirasaki (JP); Kenya Iwasaki, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/353,132

(22) Filed: Feb. 14, 2006

(65) Prior Publication Data

US 2006/0194435 A1 Aug. 31, 2006

Related U.S. Application Data

(60) Provisional application No. 60/655,904, filed on Feb. 25, 2005.

(30) Foreign Application Priority Data

Feb. 14, 2005 (JP) ............................. 2005-036716
Sep. 26, 2005 (JP) ............................. 2005-278843

(51) Int. Cl.
*B44C 1/22* (2006.01)
(52) U.S. Cl. ............................. 216/58; 216/39; 216/64; 438/637; 438/655; 438/725; 438/906
(58) Field of Classification Search ............... 216/58; 438/637
See application file for complete search history.

(56) References Cited

U.S. PATENT DOCUMENTS

| 6,265,320 | B1 * | 7/2001 | Shi et al. ................... 438/725 |
|---|---|---|---|
| 6,660,598 | B2 | 12/2003 | Hanafi et al. |
| 6,805,139 | B1 * | 10/2004 | Savas et al. .................. 134/1.3 |
| 6,838,300 | B2 * | 1/2005 | Jin et al. ....................... 438/38 |
| 2002/0146911 | A1 | 10/2002 | Muranaka et al. |
| 2004/0182417 | A1 | 9/2004 | Hamelin et al. |
| 2004/0184792 | A1 | 9/2004 | Hamelin et al. |
| 2004/0185670 | A1 | 9/2004 | Hamelin et al. |
| 2004/0241981 | A1 * | 12/2004 | Doris et al. ................. 438/637 |

OTHER PUBLICATIONS

Shamiryan, D., et al., "Comparative study of SiOCH low-k films with varied porosity interacting with etching and cleaning plasma", J. Vac. Sci. Technol., B 20(5), American Vacuum Society, Sep./Oct. 2002, pp. 1923-1928.

"Advanced BE0L Technology", Toshiba Review, vol. 59, No. 8 (2004), pp. 17-21.

Shamiryan, D., et al., "Modification of low-k SiCOH film porosity by a HF solution", Solid State Phenomena, vols. 76-77 (2001), pp. 135-138.

* cited by examiner

*Primary Examiner*—Shamim Ahmed
*Assistant Examiner*—Maki Angadi
(74) *Attorney, Agent, or Firm*—Oblon, Spivak, McClelland, Maier & Neustadt, L.L.P.

(57) ABSTRACT

A method of processing a substrate that enables the amount removed of a surface damaged layer to be controlled easily, and enable a decrease in wiring reliability to be prevented. A surface damaged layer having a reduced carbon concentration of a carbon-containing low dielectric constant insulating film on a substrate is exposed to an atmosphere of a mixed gas containing ammonia and hydrogen fluoride under a predetermined pressure. The surface damaged layer that has been exposed to the atmosphere of the mixed gas is heated to a predetermined temperature.

12 Claims, 11 Drawing Sheets

FIG. 8A
123
122
FIG. 8B
124  125
FIG. 8C
IONS, RADICALS
127  126  127
FIG. 8D
NH3  HF
128  128
FIG. 8E
SiF4  NH3
FIG. 8F
FIG. 8G
FIG. 8H
AL, Cu
FIG. 8I
129
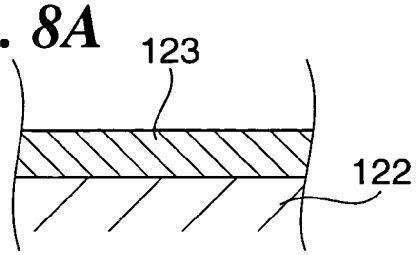
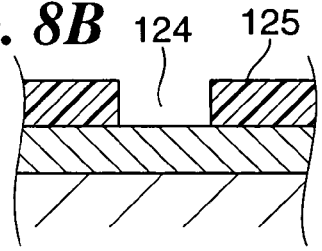
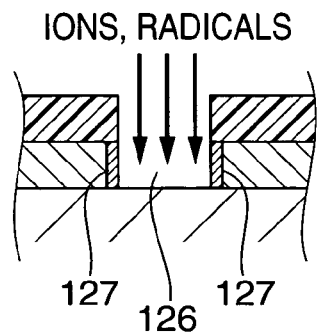
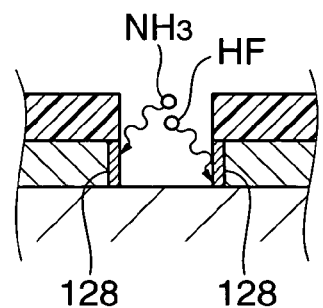
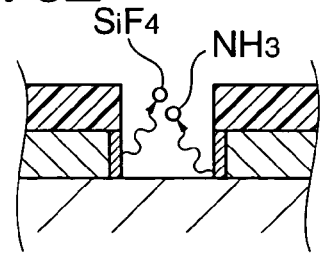
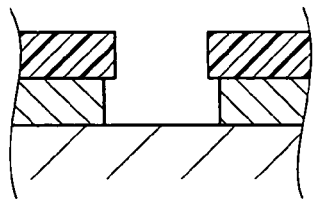
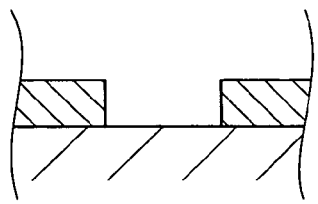
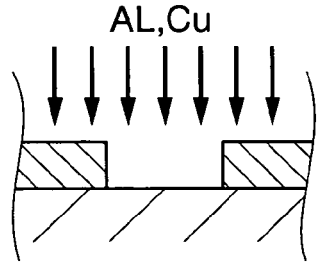
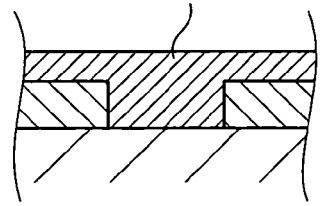

METHOD OF PROCESSING SUBSTRATE, AND METHOD OF AND PROGRAM FOR MANUFACTURING ELECTRONIC DEVICE

BACKGROUND OF THE INVENTION

1. Field of the Invention

The present invention relates to a method of processing a substrate, and a method of and program for manufacturing an electronic device, and more particularly to a method of manufacturing an electronic device having a low dielectric constant insulating film formed on a surface thereof.

2. Description of the Related Art

In a method of manufacturing an electronic device in which an electronic device is manufactured from a silicon wafer (hereinafter referred to merely as a "wafer"), a film formation step of forming a conductive film or an insulating film on a surface of the wafer by CVD (chemical vapor deposition) or the like, a lithography step of forming a photoresist layer in a desired pattern on the formed conductive film or insulating film, and an etching step of fabricating the conductive film into gate electrodes, or fabricating wiring grooves or contact holes in the insulating film, with plasma using the photoresist layer as a mask are repeatedly implemented in this order.

An electronic device manufactured using such a method of manufacturing an electronic device thus has a structure in which insulating films are disposed between conductive films that form electrodes or wiring. Such an insulating film is generally referred to as an "interlayer insulating film".

In recent years, there have been demands to realize a higher degree of integration for electronic devices, and to achieve this, the dimension to which wiring grooves are required to be fabricated has become smaller, and the required spacing between adjacent pieces of wiring has also become narrower. As the wiring groove fabrication dimension becomes smaller and the wiring spacing becomes narrower, the parasitic resistance R and the parasitic capacitance C of the wiring increases, and hence wiring delay (RC delay) caused thereby arises, and thus the speed of transmission of signals along the wiring decreases. Such wiring delay increases as the parasitic resistance R and the parasitic capacitance C increase, and hence to resolve the problem of wiring delay, the parasitic resistance R and the parasitic capacitance C must be reduced.

As a technique for reducing the parasitic capacitance C, reducing the relative dielectric constant of an interlayer insulating film is effective, and hence various low-relative dielectric constant (low-K) interlayer insulating films have been developed.

In general, $SiO_2$ is used as a material of interlayer insulating films. As a method of reducing the relative dielectric constant of $SiO_2$, a method in which the $SiO_2$ is doped with fluorine is known, but the doped fluorine tends to be released from the $SiO_2$, and hence SiOC type low dielectric constant interlayer insulating film materials, organic polymer type coated low dielectric constant interlayer insulating film materials, for example "SiLK" (registered trademark, The Dow Chemical Company), and so on that are doped with carbon instead of fluorine are currently being developed. Here, a relative dielectric constant of not more than 3.0 is referred to as a "low dielectric constant". Materials representative of those used in low dielectric constant interlayer insulating films are shown in Table 1 below.

TABLE 1

| Type | Material | | Relative dielectric constant |
|---|---|---|---|
| Inorganic | $SiO_2$ | | 4 |
| | SiOF | | 3.4 to 3.6 |
| | Si—H-containing $SiO_2$ (HSQ) | | 2.8 to 3.0 |
| | Porous silica film | | <3.0 |
| Organic film | Carbon-containing $SiO_2$ (SiOC) | | 2.7 to 2.9 |
| | Methyl group-containing $SiO_2$ (MSQ) | | 2.7 to 2.9 |
| | Porous MSQ | | 2.4 to 2.7 |
| | Polymeric films | Polyimide film | 3.0 to 3.5 |
| | | PARERIN film | 2.7 to 3.0 |
| | | PTFE Film | 2.0 to 2.4 |
| | Amorphous carbon (F added) | | <2.5 |

However, for an SiOC type low dielectric constant interlayer insulating film or organic polymer type coated low dielectric constant interlayer insulating film, a surface damaged layer having a reduced carbon concentration is formed on a disposed surface of the interlayer insulating film upon carrying out plasma processing in, for example, a reactive ion etching step of fabricating a wiring groove or the like in the interlayer insulating film, or an ashing step of removing a photoresist layer formed on the interlayer insulating film (see, for example, D. Shamiryan, "Comparative study of SiOCH low-k films with varied porosity interacting with etching and cleaning plasma", J. Vac. Sci. Technol. B20(5), American Vacuum Society, September 2002, p. 1928). Such a surface damaged layer has similar properties to $SiO_2$ (the native oxide), being readily dissolved in a subsequently implemented wet etching step using a liquid chemical (HF, $NH_4F$, etc.), and moreover undergoing volume shrinkage in a heat treatment step. It is thus necessary to implement the etching step or ashing step such that a surface damaged layer is not formed, or else remove a formed surface damaged layer before the surface damaged layer is covered with a conductive film or the like.

As an ashing process in which a surface damaged layer is not formed, a process using an $H_2O$ (water) plasma instead of an $O_2$ (oxygen) plasma is known (see, for example, Yoda, "Ko-seino haisen gijutsu" ("High-performance wiring techniques", Toshiba Review, Vol. 59, No. 8, 2004, p. 18), and as a method of removing a surface damaged layer, a method of removal through liquid chemical treatment using an organic solvent and $NH_4F$ (see, for example, Japanese Laid-open Patent Publication (Kokai) No. 2002-303993) is known.

However, in the process using plasma, a high energy is applied by the plasma to the electronic devices, which have a high degree of integration and hence have fine wiring, and hence the fine wiring may be damaged.

It is thus preferable to use the method of removing the surface damaged layer through liquid chemical treatment that does not use plasma. However, with such liquid chemical treatment, the surface damaged layer continues to be removed while in contact with the liquid chemical, and hence it is difficult to control the amount removed of the surface damaged layer, and furthermore after removal of the surface damaged layer, the surface of the low dielectric constant interlayer insulating film becomes hydrophilic due to OH groups (hydroxyl groups) formed thereon through water in the liquid chemical, and as a result there is a problem that the wiring reliability decreases through moisture absorption.

SUMMARY OF THE INVENTION

It is an object of the present invention to provide a method of processing a substrate, and a method of and program for manufacturing an electronic device, that enable the amount removed of a surface damaged layer to be controlled easily, and enable a decrease in wiring reliability to be prevented.

To attain the above object, in a first aspect of the present invention, there is provided a method of processing a substrate having a carbon-containing low dielectric constant insulating film thereon, the low dielectric constant insulating film having a surface damaged layer having a reduced carbon concentration, the method comprising a surface damaged layer exposure step of exposing the surface damaged layer to an atmosphere of a mixed gas containing ammonia and hydrogen fluoride under a predetermined pressure, and a surface damaged layer heating step of heating to a predetermined temperature the surface damaged layer that has been exposed to the atmosphere of the mixed gas.

According to this aspect, the surface damaged layer having a reduced carbon concentration is exposed to an atmosphere of a mixed gas containing ammonia and hydrogen fluoride under a predetermined pressure, and then the surface damaged layer that has been exposed to the atmosphere of the mixed gas is heated to a predetermined temperature. Upon the surface damaged layer having a reduced carbon concentration being exposed to the atmosphere of the mixed gas containing ammonia and hydrogen fluoride under the predetermined pressure, a product based on the surface damaged layer and the mixed gas is produced, and then upon the surface damaged layer that has been exposed to the atmosphere of the mixed gas being heated to the predetermined temperature, the above product is heated and thus vaporized. The surface damaged layer can thus be removed without using a liquid chemical. Moreover, the amount produced of the product can be controlled through parameters of the mixed gas. Control of the amount removed of the surface damaged layer can thus be carried out easily, and a decrease in wiring reliability can be prevented.

Preferably, in the surface damaged layer exposure step, the substrate is subjected to plasma-less etching.

According to the above method, the substrate is subjected to plasma-less etching. As a result, charge is not accumulated on a gate electrode in an electronic device manufactured from the substrate, and hence degradation or destruction of a gate oxide film can be prevented. Moreover, the electronic device is not irradiated with energetic particles, and hence semiconductor damage due to being struck by such energetic particles (i.e. crystal defects) can be prevented from occurring. Furthermore, unanticipated chemical reactions caused by plasma do not occur, and hence generation of impurities can be prevented, whereby contamination of the processing chambers in which the substrate is processed can be prevented.

Moreover, preferably, in the surface damaged layer exposure step, the substrate is subjected to dry cleaning.

According to the above method, changes in properties of the substrate surface can be suppressed, and hence a decrease in wiring reliability can be reliably prevented.

Furthermore, preferably, a volumetric flow rate ratio of the hydrogen fluoride to the ammonia in the mixed gas is in a range of 1 to $\frac{1}{2}$, and the predetermined pressure is in a range of $6.7 \times 10^{-2}$ to 4.0 Pa.

According to the above method, the volumetric flow rate ratio of the hydrogen fluoride to the ammonia in the mixed gas is in a range of 1 to $\frac{1}{2}$, and the predetermined pressure is in a range of $6.7 \times 10^{-2}$ to 4.0 Pa. As a result, production of the product can be promoted, and hence the surface damaged layer can be reliably removed.

Preferably, the predetermined temperature is in a range of 80 to 200° C.

According to the above method, the predetermined temperature is in a range of 80 to 200° C. As a result, vaporization of the product can be promoted, and hence the surface damaged layer can be reliably removed.

Preferably, the method further comprises a product production condition deciding step of measuring a shape of the low dielectric constant insulating film having the surface damaged layer, and deciding at least one of the volumetric flow rate ratio of the hydrogen fluoride to the ammonia in the mixed gas and the predetermined pressure in accordance with the measured shape.

According to the above method, the shape of the low dielectric constant insulating film having the surface damaged layer is measured, and at least one of the volumetric flow rate ratio of the hydrogen fluoride to the ammonia in the mixed gas and the predetermined pressure is decided in accordance with the measured shape. As a result, the amount removed of the surface damaged layer can be controlled precisely, and hence the efficiency of the substrate surface processing can be improved.

To attain the above object, in a second aspect of the present invention, there is provided a method of processing a substrate having thereon a mask film comprising at least one of a photoresist film and a hard mask film, the mask film having a surface damaged layer, the method comprising a surface damaged layer exposure step of exposing the surface damaged layer to an atmosphere of a mixed gas containing ammonia and hydrogen fluoride under a predetermined pressure, and a surface damaged layer heating step of heating to a predetermined temperature the surface damaged layer that has been exposed to the atmosphere of the mixed gas.

According to the above method, the surface damaged layer of the mask film is exposed to an atmosphere of a mixed gas containing ammonia and hydrogen fluoride under a predetermined pressure, and then the surface damaged layer that has been exposed to the atmosphere of the mixed gas is heated to a predetermined temperature. Upon the surface damaged layer of the mask film being exposed to the atmosphere of the mixed gas containing ammonia and hydrogen fluoride under the predetermined pressure, a product based on the surface damaged layer and the mixed gas is produced, and then upon the surface damaged layer that has been exposed to the atmosphere of the mixed gas being heated to the predetermined temperature, the above product is heated and thus vaporized. The surface damaged layer can thus be removed without using a liquid chemical. Moreover, the amount produced of the product can be controlled through parameters of the mixed gas. Control of the amount removed of the surface damaged layer can thus be carried out easily, and a decrease in wiring reliability can be prevented.

To attain the above object, in a third aspect of the present invention, there is provided a method of manufacturing an electronic device, comprising a low dielectric constant insulating film formation step of forming a carbon-containing low dielectric constant insulating film on a capacitor comprising a lower electrode, a capacitive insulating film and an upper electrode that has been formed on a semiconductor substrate, a photoresist layer formation step of forming a photoresist layer in a predetermined pattern on the formed low dielectric constant insulating film, a plasma fabrication step of fabricating a connecting hole reaching the upper electrode in the low dielectric constant insulating film by plasma processing using the formed photoresist layer, a connecting hole surface exposure step of exposing a surface of the fabricated connecting hole to an atmosphere of a mixed gas containing ammonia and hydrogen fluoride under a predetermined pressure, and a connecting hole surface heating step of heating to a predetermined temperature the surface of the connecting hole that has been exposed to the atmosphere of the mixed gas.

According to the above method, the surface of the connecting hole, which has been covered with a surface damaged layer having a reduced carbon concentration produced due to the plasma processing during the fabrication of the connecting hole in the low dielectric constant insulating film, is exposed to an atmosphere of a mixed gas containing ammonia and hydrogen fluoride under a predetermined pressure, and then the surface of the connecting hole that has been exposed to the atmosphere of the mixed gas is heated to a predetermined temperature. Upon the surface damaged layer having a reduced carbon concentration being exposed to the atmosphere of the mixed gas containing ammonia and hydrogen fluoride under the predetermined pressure, a product based on the surface damaged layer and the mixed gas is produced, and then upon the surface damaged layer that has been exposed to the atmosphere of the mixed gas being heated to the predetermined temperature, the above product is heated and thus vaporized. The surface damaged layer on the surface of the connecting hole can thus be removed without using a liquid chemical. Moreover, the amount produced of the product can be controlled through parameters of the mixed gas. Control of the amount removed of the surface damaged layer on the surface of the connecting hole can thus be carried out easily, and a decrease in wiring reliability can be prevented.

To attain the above object, in a fourth aspect of the present invention, there is provided a method of manufacturing an electronic device, comprising an interlayer insulating film formation step of forming a carbon-containing low dielectric constant insulating film on a semiconductor substrate, and forming an other insulating film having a lower carbon concentration than the low dielectric constant insulating film on the low dielectric constant insulating film, so as to form an interlayer insulating film, a plasma fabrication step of fabricating a wiring groove in the interlayer insulating film by plasma processing, a wiring groove surface exposure step of exposing at least a surface of the wiring groove at the low dielectric constant insulating film to an atmosphere of a mixed gas containing ammonia and hydrogen fluoride under a predetermined pressure, a wiring groove surface heating step of heating to a predetermined temperature the surface of the wiring groove that has been exposed to the atmosphere of the mixed gas, an other insulating film removal step of removing the other insulating film, and a wiring formation step of forming wiring by introducing a conductive material into the wiring groove.

According to the above method, the surface of the wiring groove at the low dielectric constant insulating film, which has been covered with a surface damaged layer having a reduced carbon concentration produced due to the plasma processing during the fabrication of the wiring groove in the interlayer insulating film, is exposed to an atmosphere of a mixed gas containing ammonia and hydrogen fluoride under a predetermined pressure, and then the surface of the wiring groove that has been exposed to the atmosphere of the mixed gas is heated to a predetermined temperature. Upon the surface damaged layer having a reduced carbon concentration being exposed to the atmosphere of the mixed gas containing ammonia and hydrogen fluoride under the predetermined pressure, a product based on the surface damaged layer and the mixed gas is produced, and then upon the surface damaged layer that has been exposed to the atmosphere of the mixed gas being heated to the predetermined temperature, the above product is heated and thus vaporized. The surface damaged layer on the surface of the wiring groove at the low dielectric constant insulating film can thus be removed without using a liquid chemical. Moreover, the amount produced of the product can be controlled through parameters of the mixed gas. Control of the amount removed of the surface damaged layer on the surface of the wiring groove at the low dielectric constant insulating film can thus be carried out easily, and a decrease in wiring reliability can be prevented.

Preferably, the method further comprises a photoresist layer formation step of forming a photoresist layer on the other insulating film, and an ashing step of removing the formed photoresist layer, in the ashing step, the photoresist layer is exposed to an atmosphere of a mixed gas containing ammonia and hydrogen fluoride under a predetermined pressure, and then the photoresist layer that has been exposed to the atmosphere of the mixed gas is heated to a predetermined temperature.

According to the above method, when removing the photoresist layer formed on the other insulating film, the photoresist layer is exposed to an atmosphere of a mixed gas containing ammonia and hydrogen fluoride under a predetermined pressure, and then the photoresist layer that has been exposed to the atmosphere of the mixed gas is heated to a predetermined temperature. As a result, the photoresist layer can be removed without using a liquid chemical or plasma. Moreover, the amount removed of the photoresist layer can be controlled through parameters of the mixed gas, and hence formation of residue from the photoresist layer, and unnecessary etching of a layer below the photoresist layer can be prevented.

To attain the above object, in a fifth aspect of the present invention, there is provided a method of manufacturing an electronic device, comprising a conductive film formation step of forming a silicon-containing conductive film on a semiconductor substrate, a low dielectric constant insulating film formation step of forming a carbon-containing low dielectric constant insulating film on the formed conductive film, a photoresist layer formation step of forming a photoresist layer in a predetermined pattern on the formed low dielectric constant insulating film, a plasma fabrication step of fabricating a connecting hole reaching the conductive film in the low dielectric constant insulating film by plasma processing using the formed photoresist layer, a connecting hole surface exposure step of exposing a surface of the fabricated connecting hole to an atmosphere of a mixed gas containing ammonia and hydrogen fluoride under a predetermined pressure, a connecting hole surface heating step of heating to a predetermined temperature the surface of the connecting hole that has been exposed to the atmosphere of the mixed gas, an ashing step of removing the photoresist layer, and a wiring formation step of forming wiring by introducing a conductive material into the connecting hole.

According to the above method, the surface of the connecting hole, which has been covered with a surface damaged layer having a reduced carbon concentration produced due to the plasma processing during the fabrication of the connecting hole in the low dielectric constant insulating film, is exposed to an atmosphere of a mixed gas containing ammonia and hydrogen fluoride under a predetermined pressure, and then the surface of the connecting hole that has been exposed to the atmosphere of the mixed gas is heated to a predetermined temperature. Upon the surface damaged layer having a reduced carbon concentration being exposed to the atmosphere of the mixed gas containing ammonia and hydrogen fluoride under the predetermined pressure, a product based on the surface damaged layer and the mixed gas is produced, and then upon the surface damaged layer that has been exposed to the atmosphere of the mixed gas being heated to the predetermined temperature, the above product is heated and thus vaporized. The surface damaged layer on the surface of the connecting hole can thus be removed without using a liquid chemical. Moreover, the amount produced of the product can be controlled through parameters of the mixed gas. Control of the amount removed of the surface damaged layer on the surface of the connecting hole can thus be carried out easily, and a decrease in wiring reliability can be prevented.

To attain the above object, in a sixth aspect of the present invention, there is provided a program for causing a computer to execute a method of processing a substrate having a carbon-containing low dielectric constant insulating film thereon, the low dielectric constant insulating film having a surface damaged layer having a reduced carbon concentration, the program comprising a surface damaged layer exposure module for exposing the surface damaged layer to an atmosphere of a mixed gas containing ammonia and hydrogen fluoride under a predetermined pressure, and a surface damaged layer heating module for heating to a predetermined temperature the surface damaged layer that has been exposed to the atmosphere of the mixed gas.

According to the above program, effects as for the first aspect can be achieved.

To attain the above object, in a seventh aspect of the present invention, there is provided a program for causing a computer to execute a method of processing a substrate having thereon a mask film comprising at least one of a photoresist film and a hard mask film, the mask film having a surface damaged layer, the program comprising a surface damaged layer exposure module for exposing the surface damaged layer to an atmosphere of a mixed gas containing ammonia and hydrogen fluoride under a predetermined pressure, and a surface damaged layer heating module for heating to a predetermined temperature the surface damaged layer that has been exposed to the atmosphere of the mixed gas.

According to the above program, effects as for the second aspect can be achieved.

To attain the above object, in an eighth aspect of the present invention, there is provided a program for causing a computer to execute a method of manufacturing an electronic device, the program comprising a low dielectric constant insulating film formation module for forming a carbon-containing low dielectric constant insulating film on a capacitor comprising a lower electrode, a capacitive insulating film and an upper electrode that has been formed on a semiconductor substrate, a photoresist layer formation module for forming a photoresist layer in a predetermined pattern on the formed low dielectric constant insulating film, a plasma fabrication module for fabricating a connecting hole reaching the upper electrode in the low dielectric constant insulating film by plasma processing using the formed photoresist layer, a connecting hole surface exposure module for exposing a surface of the fabricated connecting hole to an atmosphere of a mixed gas containing ammonia and hydrogen fluoride under a predetermined pressure, and a connecting hole surface heating module for heating to a predetermined temperature the surface of the connecting hole that has been exposed to the atmosphere of the mixed gas.

According to the above program, effects as for the third aspect can be achieved.

To attain the above object, in a ninth aspect of the present invention, there is provided a program for causing a computer to execute a method of manufacturing an electronic device, the program comprising an interlayer insulating film formation module for forming a carbon-containing low dielectric constant insulating film on a semiconductor substrate, and forming an other insulating film having a lower carbon concentration than the low dielectric constant insulating film on the low dielectric constant insulating film, so as to form an interlayer insulating film, a plasma fabrication module for fabricating a wiring groove in the interlayer insulating film by plasma processing, a wiring groove surface exposure module for exposing at least a surface of the wiring groove at the low dielectric constant insulating film to an atmosphere of a mixed gas containing ammonia and hydrogen fluoride under a predetermined pressure, a wiring groove surface heating module for heating to a predetermined temperature the surface of the wiring groove that has been exposed to the atmosphere of the mixed gas, an other insulating film removal module for removing the other insulating film, and a wiring formation module for forming wiring by introducing a conductive material into the wiring groove.

According to the above program, effects as for the fourth aspect can be achieved.

To attain the above object, in a tenth aspect of the present invention, there is provided a program for causing a computer to execute a method of manufacturing an electronic device, the program comprising a conductive film formation module for forming a silicon-containing conductive film on a semiconductor substrate, a low dielectric constant insulating film formation module for forming a carbon-containing low dielectric constant insulating film on the formed conductive film, a photoresist layer formation module for forming a photoresist layer in a predetermined pattern on the formed low dielectric constant insulating film, a plasma fabrication module for fabricating a connecting hole reaching the conductive film in the low dielectric constant insulating film by plasma processing using the formed photoresist layer, a connecting hole surface exposure module for exposing a surface of the fabricated connecting hole to an atmosphere of a mixed gas containing ammonia and hydrogen fluoride under a predetermined pressure, a connecting hole surface heating module for heating to a predetermined temperature the surface of the connecting hole that has been exposed to the atmosphere of the mixed gas, an ashing module for removing the photoresist layer, and a wiring formation module for forming wiring by introducing a conductive material into the connecting hole.

According to the above program, effects as for the fifth aspect can be achieved.

The above and other objects, features, and advantages of the invention will become more apparent from the following detailed description taken in conjunction with the accompanying drawings.

BRIEF DESCRIPTION OF THE DRAWINGS

FIG. 2A is a sectional view taken along line II-II in FIG. 1; and

FIG. 2B is an enlarged view of a portion A shown in FIG. 2A;

FIGS. 8A to 8I constitute a process diagram showing a second variation of the method of manufacturing an electronic device according to the above embodiment;

DETAILED DESCRIPTION OF THE PREFERRED EMBODIMENTS

The present invention will now be described in detail with reference to the drawings showing preferred embodiments thereof.

First, a method of processing a substrate according to an embodiment of the present invention will be described.

Figure 1:
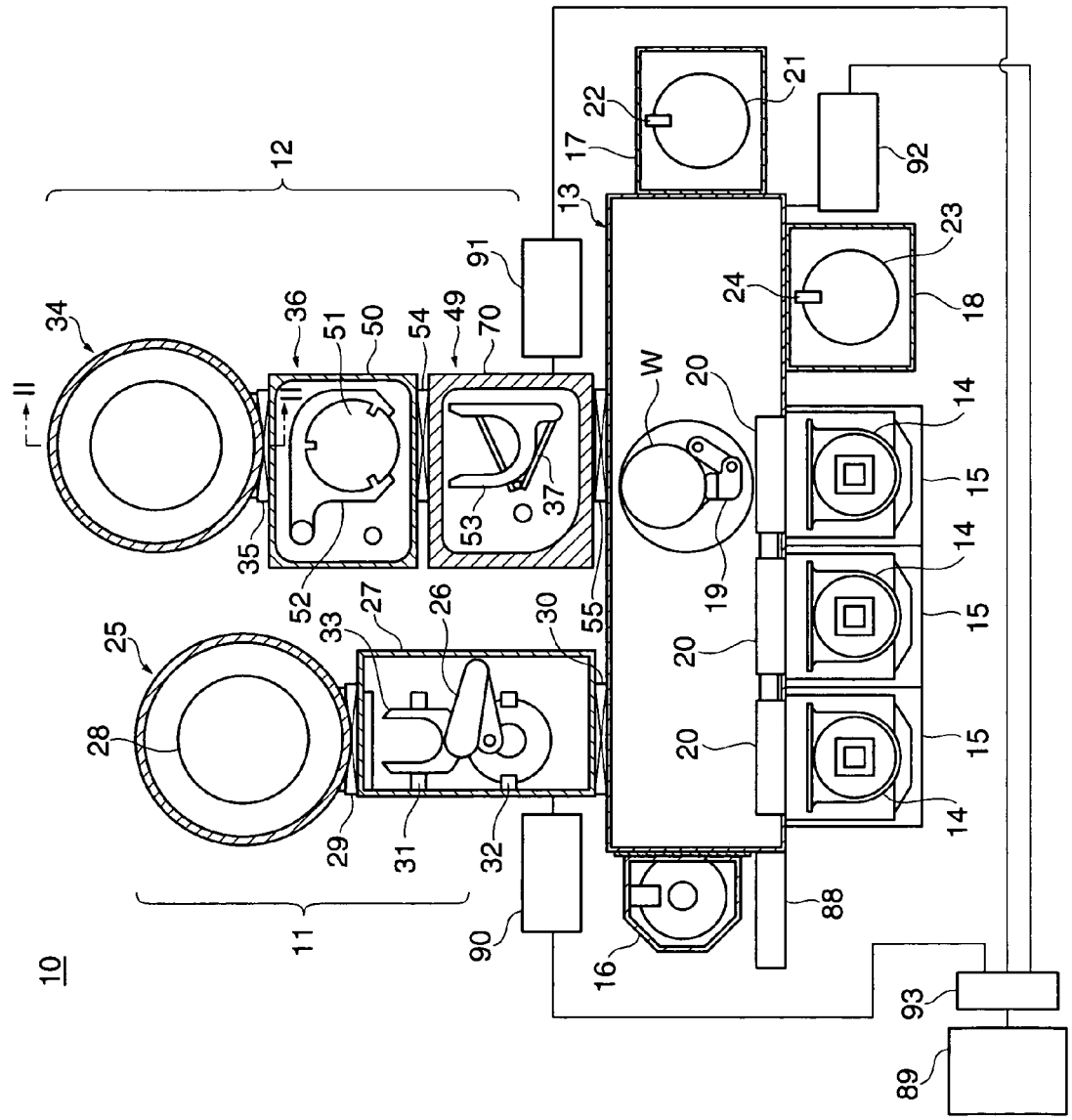
FIG. 1 is a plan view schematically showing the construction of a substrate processing apparatus to which is applied a method of processing a substrate according to an embodiment of the present invention.

FIG. 1 is a plan view schematically showing the construction of a substrate processing apparatus to which is applied the method of processing a substrate according to the present embodiment.

As shown in FIG. 1, the substrate processing apparatus 10 is comprised of a first process ship 11 for carrying out reactive ion etching (hereinafter referred to as "RIE") on electronic device wafers (hereinafter referred to as merely "wafers") (substrates) W, a second process ship 12 that is disposed parallel to the first process ship 11 and is for carrying out COR (chemical oxide removal) processing and PHT (post heat treatment) processing, described below, on wafers W that have been subjected to the RIE process in the first process ship 11, and a loader unit 13, which is a rectangular common transfer chamber to which each of the first process ship 11 and the second process ship 12 is connected.

In addition to the first process ship 11 and the second process ship 12, the loader unit 13 has connected thereto three FOUP mounting stages 15 on each of which is mounted a FOUP (front opening unified pod) 14, which is a container housing twenty-five of the wafers W, an orienter 16 that carries out pre-alignment of the position of each wafer W transferred out from a FOUP 14, and first and second IMS's 17 and 18 (Integrated Metrology Systems, made by Therma-Wave, Inc.) for measuring the surface state of each wafer W.

The first process ship 11 and the second process ship 12 are each connected to a side wall of the loader unit 13 in a longitudinal direction of the loader unit 13, disposed facing the three FOUP mounting stages 15 with the loader unit 13 therebetween. The orienter 16 is disposed at one end of the loader unit 13 in the longitudinal direction of the loader unit 13. The first IMS 17 is disposed at the other end of the loader unit 13 in the longitudinal direction of the loader unit 13. The second IMS 18 is disposed alongside the three FOUP mounting stages 15.

A SCARA-type dual arm transfer arm mechanism 19 for transferring the wafers W is disposed inside the loader unit 13, and three loading ports 20 through which the wafers W are introduced into the loader unit 13 are disposed in a side wall of the loader unit 13 in correspondence with the FOUP mounting stages 15. The transfer arm mechanism 19 takes a wafer W out from a FOUP 14 mounted on a FOUP mounting stage 15 through the corresponding loading port 20, and transfers the removed wafer W into and out of the first process ship 11, the second process ship 12, the orienter 16, the first IMS 17, and the second IMS 18.

The first IMS 17 is an optical monitor having a mounting stage 21 on which is mounted a wafer W that has been transferred into the first IMS 17, and an optical sensor 22 that is directed at the wafer W mounted on the mounting stage 21. The first IMS 17 measures the surface form of the wafer W, for example the thickness of a surface layer, and CD (critical dimension) values of wiring grooves, gate electrodes and so on. Like the first IMS 17, the second IMS 18 is also an optical monitor, and has a mounting stage 23 and an optical sensor 24. The second IMS 18 measures the number of particles on the surface of each wafer W.

The first process ship 11 has a first processing unit 25 as a first vacuum processing chamber in which RIE is carried out on each wafer W, and a first load lock unit 27 containing a link-type single-pick type first transfer arm 26 for transferring each wafer W into and out of the first processing unit 25.

The first processing unit 25 has a cylindrical processing chamber, and an upper electrode and a lower electrode disposed in the chamber. The distance between the upper electrode and the lower electrode is set to an appropriate value for carrying out the RIE process on each wafer W. Moreover, the lower electrode has in a top portion thereof an ESC (electrostatic chuck) 28 for chucking the wafer W thereto using a coulomb force or the like.

In the first processing unit 25, a processing gas is introduced into the chamber and an electric field is generated between the upper electrode and the lower electrode, whereby the introduced processing gas is turned into plasma so as to produce ions and radicals. The wafer W is subjected to the RIE process by the ions and radicals.

In the first process ship 11, the internal pressure of the first processing unit 25 is held at vacuum, whereas the internal pressure of the loader unit 13 is held at atmospheric pressure. The first load lock unit 27 is thus provided with a vacuum gate valve 29 in a connecting part between the first load lock unit 27 and the first processing unit 25, and an atmospheric gate valve 30 in a connecting part between the first load lock unit 27 and the loader unit 13, whereby the first load lock unit 27 is constructed as a preliminary vacuum transfer chamber whose internal pressure can be adjusted.

Within the first load lock unit 27, the first transfer arm 26 is disposed in an approximately central portion of the first load lock unit 27; first buffers 31 are disposed toward the first processing unit 25 with respect to the first transfer arm 26, and second buffers 32 are disposed toward the loader unit 13 with respect to the first transfer arm 26. The first buffers 31 and the second buffers 32 are disposed above a track along which a supporting portion (pick) 33 moves, the supporting portion 33 being disposed at the distal end of the first transfer arm 26 and being for supporting each wafer W. After having being subjected to the RIE process, each wafer W is temporarily laid by above the track of the supporting portion 33, whereby swapping over of the wafer W that has been subjected to the RIE process and a wafer W yet to be subjected to the RIE process can be carried out smoothly in the first processing unit 25.

The second process ship 12 has a second processing unit 34 as a second vacuum processing chamber in which the COR processing is carried out on each wafer W, a third processing unit 36 as a third vacuum processing chamber that is connected to the second processing unit 34 via a vacuum gate valve 35 and in which the PHT processing is carried out on each wafer W, and a second load lock unit 49 containing a link-type single-pick type second transfer arm 37 for transferring each wafer W into and out of the second processing unit 34 and the third processing unit 36.

Figure 2A:
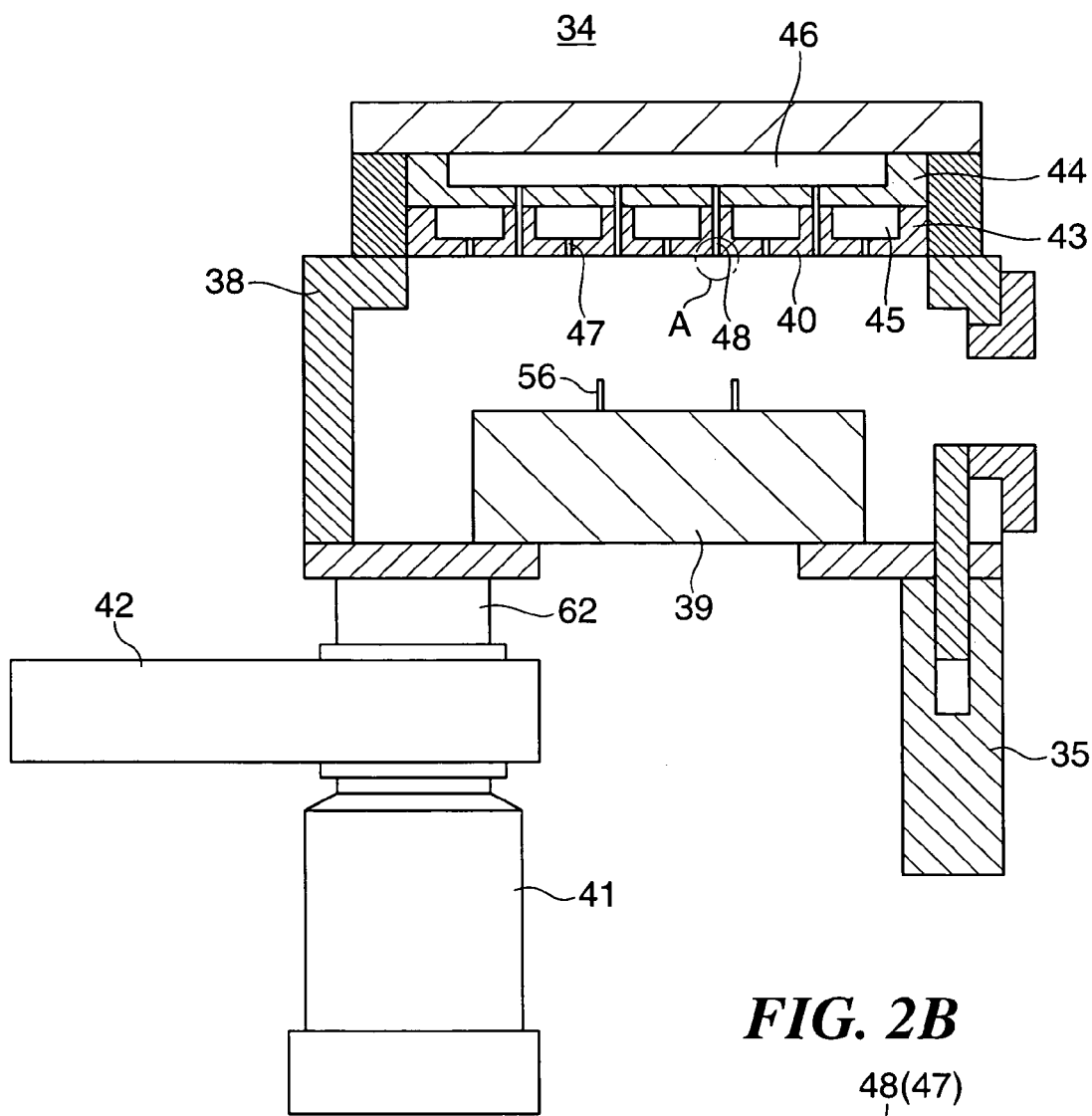
FIGS. 2A and 2B are sectional views of a second processing unit appearing in FIG. 1; specifically.
Figure 2B:
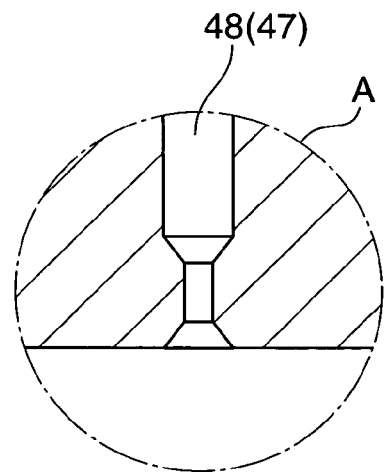

FIGS. 2A and 2B are sectional views of the second processing unit 34 appearing in FIG. 1; specifically, FIG. 2A is a sectional view taken along line II-II in FIG. 1, and FIG. 2B is an enlarged view of a portion A shown in FIG. 2A.

As shown in FIG. 2A, the second processing unit 34 has a cylindrical processing chamber (chamber) 38, an ESC 39 as a wafer W mounting stage disposed in the processing chamber 38, a shower head 40 disposed above the chamber 38, a TMP (turbo molecular pump) 41 for exhausting gas out from the chamber 38, and an APC (automatic pressure control) valve 42 that is a variable butterfly valve disposed between the chamber 38 and the TMP 41 for controlling the pressure in the chamber 38.

The ESC 39 has therein an electrode plate (not shown) to which a DC voltage is applied. A wafer W is attracted to and held on the ESC 39 through a Johnsen-Rahbek force or a Coulomb force generated by the DC voltage. Moreover, the ESC 39 also has a coolant chamber (not shown) as a temperature adjusting mechanism. A coolant, for example cooling water or a Galden fluid, at a predetermined temperature is circulated through the coolant chamber. A processing temperature of the wafer W held on an upper surface of the ESC 39 is controlled through the temperature of the coolant. Furthermore, the ESC 39 also has a heat-transmitting gas supply system (not shown) that supplies a heat-transmitting gas (helium gas) uniformly between the upper surface of the ESC 39 and a rear surface of the wafer. The heat-transmitting gas carries out heat exchange between the wafer and the ESC 39, which is held at a desired specified temperature by the coolant during the COR, thus cooling the wafer efficiently and uniformly.

Moreover, the ESC 39 has a plurality of pusher pins 56 as lifting pins that can be made to project out from the upper surface of the ESC 39. The pusher pins 56 are housed inside the ESC 39 when a wafer W is attracted to and held on the ESC 39, and are made to project out from the upper surface of the ESC 39 so as to lift the wafer W up when the wafer W is to be transferred out from the chamber 38 after having been subjected to the COR processing.

The shower head 40 has a two-layer structure comprised of a lower layer portion 43 and an upper layer portion 44. The lower layer portion 43 has first buffer chambers 45 therein, and the upper layer portion 44 has a second buffer chamber 46 therein. The first buffer chambers 45 and the second buffer chamber 46 are communicated with the chamber 38 via gas-passing holes 47 and 48 respectively. That is, the shower head 40 is comprised of two plate-shaped members (the lower layer portion 43 and the upper layer portion 44) that are disposed on one another and have therein internal channels leading into the chamber 38 for gas supplied into the first buffer chambers 45 and the second buffer chamber 46.

When carrying out the COR processing on a wafer W, $NH_3$ (ammonia) gas is supplied into the first buffer chambers 45 from an ammonia gas supply pipe 57, described below, and the supplied ammonia gas is then supplied via the gas-passing holes 47 into the chamber 38, and moreover HF (hydrogen fluoride) gas is supplied into the second buffer chamber 46 from a hydrogen fluoride gas supply pipe 58, described below, and the supplied hydrogen fluoride gas is then supplied via the gas-passing holes 48 into the chamber 38.

Moreover, the shower head 40 also has a heater, for example a heating element, (not shown) built therein. The heating element is preferably disposed on the upper layer portion 44, for controlling the temperature of the hydrogen fluoride gas in the second buffer chamber 46.

Moreover, a portion of each of the gas-passing holes 47 and 48 where the gas-passing hole 47 or 48 opens out into the chamber 38 is formed so as to widen out toward an end thereof as shown in FIG. 2B. As a result, the ammonia gas and the hydrogen fluoride gas can be made to diffuse through the chamber 38 efficiently. Furthermore, each of the gas-passing holes 47 and 48 has a cross-sectional shape having a constriction therein. As a result, any deposit produced in the chamber 38 can be prevented from flowing back into the gas-passing holes 47 and 48, and thus the first buffer chambers 45 and the second buffer chamber 46. Alternatively, the gas-passing holes 47 and 48 may each have a spiral shape.

In the second processing unit 34, the COR processing is carried out on a wafer W by adjusting the pressure in the chamber 38 and the volumetric flow rate ratio between the ammonia gas and the hydrogen fluoride gas. Moreover, the second processing unit 34 is designed such that the ammonia gas and the hydrogen fluoride gas first mix with one another in the chamber 38 (post-mixing design), and hence the two gases are prevented from mixing together until they are introduced into the chamber 38, whereby the hydrogen fluoride gas and the ammonia gas are prevented from reacting with one another before being introduced into the chamber 38.

Moreover, in the second processing unit 34, a heater, for example a heating element, (not shown) is built into a side wall of the chamber 38, whereby the temperature of the atmosphere in the chamber 38 can be prevented from decreasing. As a result, the reproducibility of the COR processing can be improved. Moreover, the heating element in the side wall also controls the temperature of the side wall, whereby by-products formed in the chamber 38 can be prevented from becoming attached to the inside of the side wall.

Returning to FIG. 1, the third processing unit 36 has a box-shaped processing chamber (chamber) 50, a stage heater 51 as a wafer W mounting stage disposed in the chamber 50, a buffer arm 52 that is disposed around the stage heater 51 and lifts up a wafer W mounted on the stage heater 51, and an PHT chamber lid (not shown) as an openable/closable lid that isolates the interior of the chamber from the external atmosphere.

The stage heater 51 is made of aluminum having an oxide film formed on a surface thereof, and heats the wafer W mounted thereon up to a predetermined temperature through heating wires or the like built therein. Specifically, the stage heater 51 directly heats the wafer W mounted thereon up to 100 to 200° C., preferably approximately 135° C., over at least 1 minute.

The PHT chamber lid has a sheet heater made of silicone rubber disposed thereon. Moreover, a cartridge heater (not shown) is built into a side wall of the chamber 50. The cartridge heater controls the wall surface temperature of the side wall of the chamber 50 to a temperature in a range of 25 to 80° C. As a result, by-products are prevented from becoming attached to the side wall of the chamber 50, whereby particles due to such attached by-products are prevented from arising, and hence the time period between one cleaning and the next of the chamber 50 can be extended. Moreover, an outer periphery of the chamber 50 is covered by a heat shield.

Instead of the sheet heater described above, a UV (ultraviolet) radiation heater may alternatively be used as the heater for heating the wafer W from above. An example of such a UV radiation heater is a UV lamp that emits UV of wavelength 190 to 400 nm.

After being subjected to the COR processing, each wafer W is temporarily laid by above a track of a supporting portion 53 of the second transfer arm 37 by the buffer arm 52, whereby swapping over of wafers W in the second processing unit 34 and the third processing unit 36 can be carried out smoothly.

In the third processing unit 36, the PHT processing is carried out on each wafer W by adjusting the temperature of the wafer W.

The second load lock unit 49 has a box-shaped transfer chamber (chamber) 70 containing the second transfer arm 37. The internal pressure of each of the second processing unit 34 and the third processing unit 36 is held at vacuum, whereas the internal pressure of the loader unit 13 is held at atmospheric pressure. The second load lock unit 49 is thus provided with a vacuum gate valve 54 in a connecting part between the second load lock unit 49 and the third processing unit 36, and an atmospheric door valve 55 in a connecting part between the second load lock unit 49 and the loader unit 13, whereby the second load lock unit 49 is constructed as a preliminary vacuum transfer chamber whose internal pressure can be adjusted.

Figure 3:
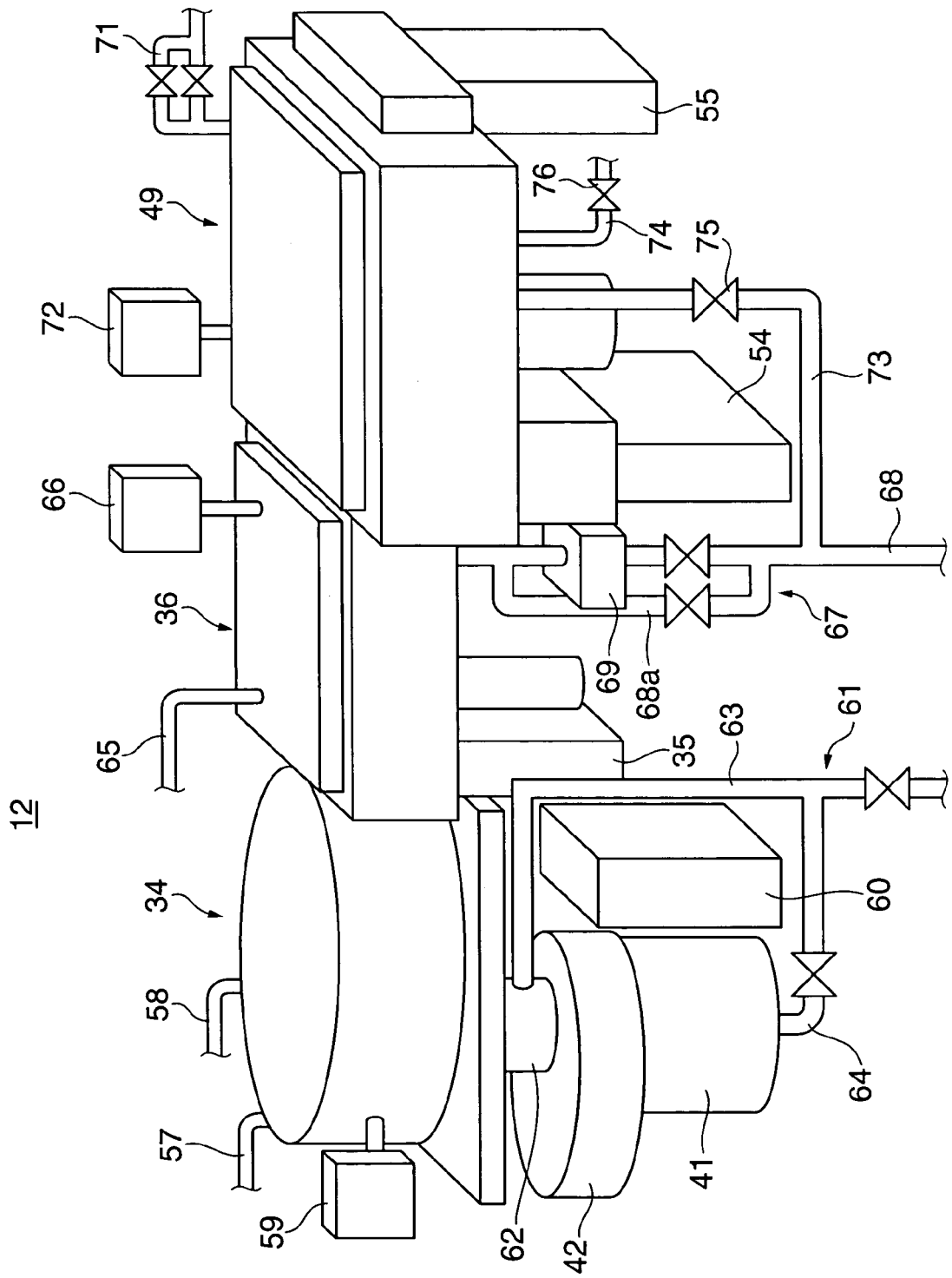
FIG. 3 is a perspective view schematically showing the construction of a second process ship appearing in FIG. 1.

FIG. 3 is a perspective view schematically showing the construction of the second process ship 12 appearing in FIG. 1.

As shown in FIG. 3, the second processing unit 34 has the ammonia gas supply pipe 57 for supplying ammonia gas into the first buffer chambers 45, the hydrogen fluoride gas supply pipe 58 for supplying hydrogen fluoride gas into the second buffer chamber 46, a pressure gauge 59 for measuring the pressure in the chamber 38, and a chiller unit 60 that supplies a coolant into the cooling system provided in the ESC 39.

The ammonia gas supply pipe 57 has provided therein an MFC (mass flow controller) (not shown) for adjusting the flow rate of the ammonia gas supplied into the first buffer chambers 45, and the hydrogen fluoride gas supply pipe 58 has provided therein an MFC (not shown) for adjusting the flow rate of the hydrogen fluoride gas supplied into the second buffer chamber 46. The MFC in the ammonia gas supply pipe 57 and the MFC in the hydrogen fluoride gas supply pipe 58 operate collaboratively so as to adjust the volumetric flow rate ratio between the ammonia gas and the hydrogen fluoride gas supplied into the chamber 38.

Moreover, a second processing unit exhaust system 61 connected to a DP (dry pump) (not shown) is disposed below the second processing unit 34. The second processing unit exhaust system 61 is for exhausting gas out from the chamber 38, and has an exhaust pipe 63 that is communicated with an exhaust duct 62 provided between the chamber 38 and the APC valve 42, and an exhaust pipe 64 connected below (i.e. on the exhaust side) of the TMP 41. The exhaust pipe 64 is connected to the exhaust pipe 63 upstream of the DP.

The third processing unit 36 has a nitrogen gas supply pipe 65 for supplying nitrogen ($N_2$) gas into the chamber 50, a pressure gauge 66 for measuring the pressure in the chamber 50, and a third processing unit exhaust system 67 for exhausting the nitrogen gas out from the chamber 50.

The nitrogen gas supply pipe 65 has provided therein an MFC (not shown) for adjusting the flow rate of the nitrogen gas supplied into the chamber 50. The third processing unit exhaust system 67 has a main exhaust pipe 68 that is communicated with the chamber 50 and is connected to a DP, an APC valve 69 that is disposed part way along the main exhaust pipe 68, and an auxiliary exhaust pipe 68a that branches off from the main exhaust pipe 68 so as to circumvent the APC valve 69 and is connected to the main exhaust pipe 68 upstream of the DP. The APC valve 69 controls the pressure in the chamber 50.

The second load lock unit 49 has a nitrogen gas supply pipe 71 for supplying nitrogen gas into the chamber 70, a pressure gauge 72 for measuring the pressure in the chamber 70, a second load lock unit exhaust system 73 for exhausting the nitrogen gas out from the chamber 70, and an external atmosphere communicating pipe 74 for releasing the interior of the chamber 70 to the external atmosphere.

The nitrogen gas supply pipe 71 has provided therein an MFC (not shown) for adjusting the flow rate of the nitrogen gas supplied into the chamber 70. The second load lock unit exhaust system 73 is comprised of a single exhaust pipe, which is communicated with the chamber 70 and is connected to the main exhaust pipe 68 of the third processing unit exhaust system 67 upstream of the DP. Moreover, the second load lock unit exhaust system 73 has an openable/closable exhaust valve 75 therein, and the external atmosphere communicating pipe 74 has an openable/closable relief valve 76 therein. The exhaust valve 75 and the relief valve 76 are operated collaboratively so as to adjust the pressure in the chamber 70 to any pressure from atmospheric pressure to a desired degree of vacuum.

Figure 4:
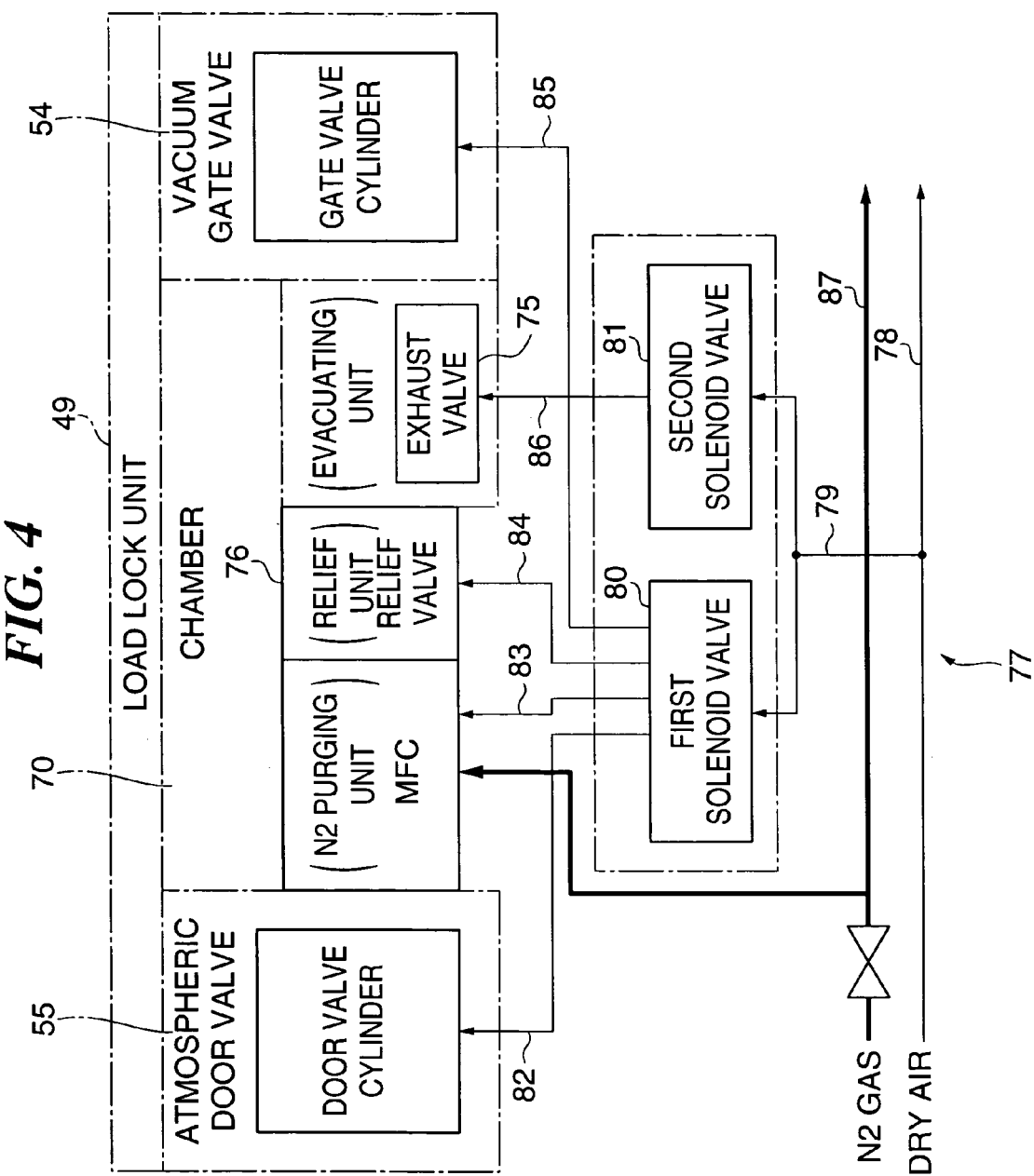
FIG. 4 is a diagram schematically showing the construction of a unit-driving dry air supply system for a second load lock unit appearing in FIG. 3.

FIG. 4 is a diagram schematically showing the construction of a unit-driving dry air supply system for the second load lock unit 49 appearing in FIG. 3.

As shown in FIG. 4, dry air from the unit-driving dry air supply system 77 for the second load lock unit 49 is supplied to a door valve cylinder for driving a sliding door of the atmospheric door valve 55, the MFC in the nitrogen gas supply pipe 71 as an $N_2$ purging unit, the relief valve 76 in the external atmosphere communicating pipe 74 as a relief unit for releasing the interior of the chamber 70 to the external atmosphere, the exhaust valve 75 in the second load lock unit exhaust system 73 as an evacuating unit, and a gate valve cylinder for driving a sliding gate of the vacuum gate valve 54.

The unit-driving dry air supply system 77 has an auxiliary dry air supply pipe 79 that branches off from a main dry air supply pipe 78 of the second process ship 12, and a first solenoid valve 80 and a second solenoid valve 81 that are connected to the auxiliary dry air supply pipe 79.

The first solenoid valve 80 is connected respectively to the door valve cylinder, the MFC, the relief valve 76, and the gate valve cylinder by dry air supply pipes 82, 83, 84, and 85, and controls operation of these elements by controlling the amount of dry air supplied thereto. Moreover, the second solenoid valve 81 is connected to the exhaust valve 75 by a dry air supply pipe 86, and controls operation of the exhaust valve 75 by controlling the amount of dry air supplied to the exhaust valve 75.

The MFC in the nitrogen gas supply pipe 71 is also connected to a nitrogen ($N_2$) gas supply system 87.

The second processing unit 34 and the third processing unit 36 also each has a unit-driving dry air supply system having a similar construction to the unit-driving dry air supply system 77 for the second load lock unit 49 described above.

Returning to FIG. 1, the substrate processing apparatus 10 has a system controller for controlling operations of the first process ship 11, the second process ship 12 and the loader unit 13, and an operation controller 88 that is disposed at one end of the loader unit 13 in the longitudinal direction of the loader unit 13.

The operation controller 88 has a display section comprised of, for example, an LCD (liquid crystal display), for displaying the state of operation of the component elements of the substrate processing apparatus 10.

Figure 5:
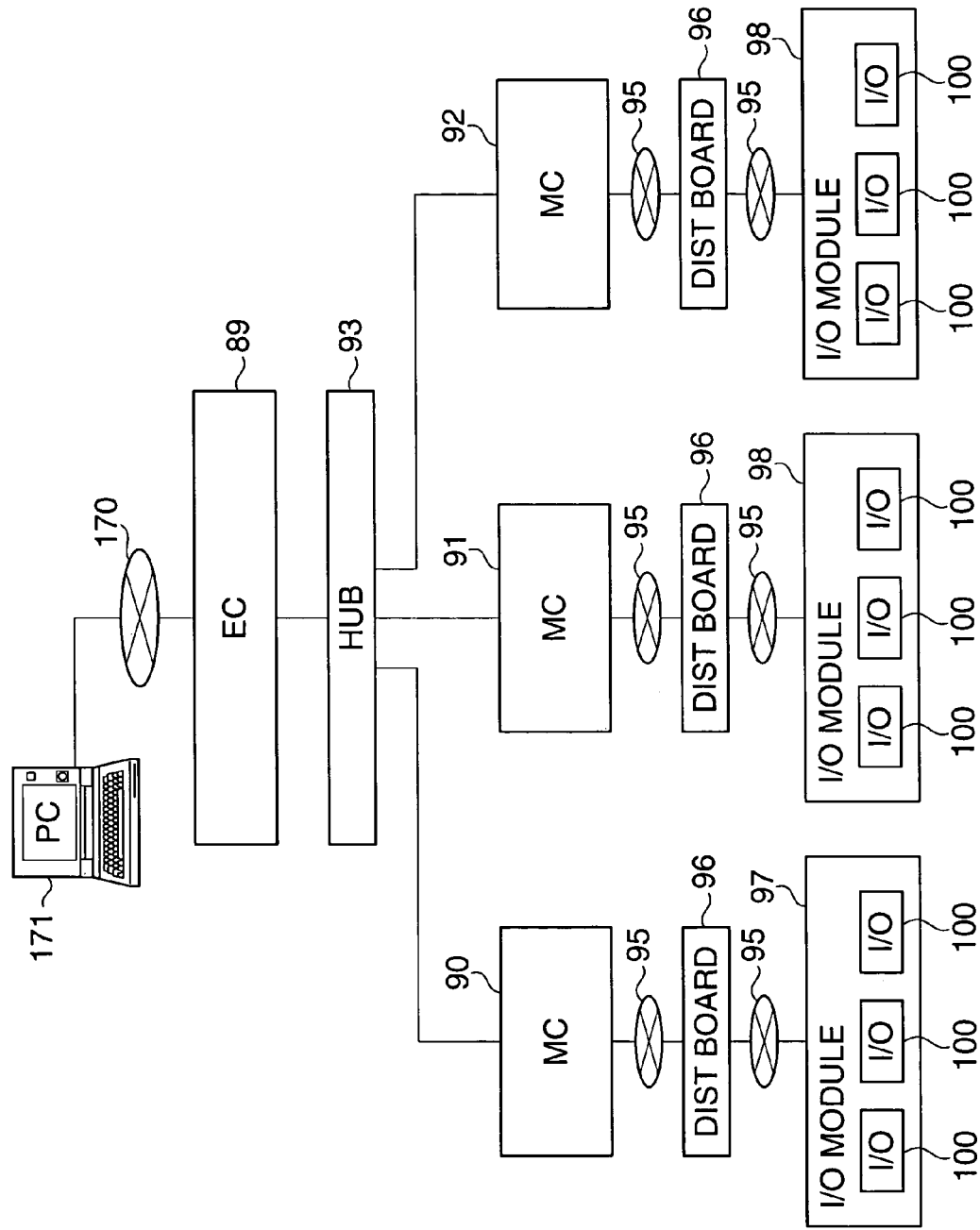
FIG. 5 is a diagram schematically showing the construction of a system controller for the substrate processing apparatus shown in FIG. 1.

Moreover, as shown in FIG. 5, the system controller is comprised of an EC (equipment controller) 89, three MC's (module controllers) 90, 91 and 92, and a switching hub 93 that connects the EC 89 to each of the MC's. The EC 89 of the system controller is connected via a LAN (local area network) 170 to a PC 171, which is an MES (manufacturing execution system) that carries out overall control of the manufacturing processes in the manufacturing plant in which the substrate processing apparatus 10 is installed. In collaboration with the system controller, the MES feeds back real real-time data on the processes in the manufacturing plant to a basic work system (not shown), and makes decisions relating to the processes in view of the overall load on the manufacturing plant and so on.

The EC 89 is a master controller (main controller) that controls the MC's and carries out overall control of the operation of the substrate processing apparatus 10. The EC 89 has a CPU, a RAM, an HDD and so on. The CPU sends control signals to the MC's in accordance with programs corresponding to wafer W processing methods, i.e. recipes, specified by a user using the operation controller 88, thus controlling the operations of the first process ship 11, the second process ship 12 and the loader unit 13.

The switching hub 93 selects at least one connection among the connections between the EC 89 and MC's in accordance with the control signals from the EC 89.

The MC's 90, 91 and 92 are slave controllers (auxiliary controllers) that control the operations of the first process ship 11, the second process ship 12, and the loader unit 13 respectively. Each of the MC's is connected respectively to an I/O (input/output) module 97, 98 or 99 through a DIST (distribution) board 96 via a GHOST network 95. Each GHOST network 95 is a network which is realized through an LSI known as a GHOST (general high-speed optimum scalable transceiver) on an MC board of the corresponding MC. A maximum of 31 I/O modules can be connected to each GHOST network 95; with respect to the GHOST network 95, the MC is the master, and the I/O modules are slaves.

The I/O module 98 is comprised of a plurality of I/O units 100 that are connected to component elements (hereinafter referred to as "end devices") of the second process ship 12, and transmits control signals to the end devices and output signals from the end devices. Examples of the end devices connected to the I/O units 100 of the I/O module 98 are: in the second processing unit 34, the MFC in the ammonia gas supply pipe 57, the MFC in the hydrogen fluoride gas supply pipe 58, the pressure gauge 59, and the APC valve 42; in the third processing unit 36, the MFC in the nitrogen gas supply pipe 65, the pressure gauge 66, the APC valve 69, the buffer arm 52, and the stage heater 51; in the second load lock unit 49, the MFC in the nitrogen gas supply pipe 71, the pressure gauge 72, and the second transfer arm 37; and in the unit-driving dry air supply system 77, the first solenoid valve 80, and the second solenoid valve 81.

Each of the I/O modules 97 and 99 has a similar construction to the I/O module 98. Moreover, the connection between the I/O module 97 and the MC 90 for the first process ship 11, and the connection between the I/O module 99 and the MC 92 for the loader unit 13 are constructed similarly to the connection between the I/O module 98 and the MC 91 described above, and hence description thereof is omitted.

Each GHOST network 95 is also connected to an I/O board (not shown) that controls input/output of digital signals, analog signals and serial signals to/from the I/O units 100.

In the substrate processing apparatus 10, when carrying out the COR processing on a wafer W, the CPU of the EC 89 implements the COR processing in the second processing unit 34 by sending control signals to desired end devices via the switching hub 93, the MC 91, the GHOST network 95, and the I/O units 100 of the I/O module 98, in accordance with a program corresponding to a recipe for the COR processing.

Specifically, the CPU sends control signals to the MFC in the ammonia gas supply pipe 57 and the MFC in the hydrogen fluoride gas supply pipe 58 so as to adjust the volumetric flow rate ratio between the ammonia gas and the hydrogen fluoride gas in the chamber 38 to a desired value, and sends control signals to the TMP 41 and the APC valve 42 so as to adjust the pressure in the chamber 38 to a desired value. Moreover, at this time, the pressure gauge 59 sends the value of the pressure in the chamber 38 to the CPU of the EC 89 in the form of an output signal, and the CPU determines control parameters for the MFC in the ammonia gas supply pipe 57, the MFC in the hydrogen fluoride gas supply pipe 58, the APC valve 42, and the TMP 41 based on the sent value of the pressure in the chamber 38.

Moreover, when carrying out the PHT processing on a wafer W, the CPU of the EC 89 implements the PHT processing in the third processing unit 36 by sending control signals to desired end devices in accordance with a program corresponding to a recipe for the PHT processing.

Specifically, the CPU sends control signals to the MFC in the nitrogen gas supply pipe 65, and the APC valve 69 so as to adjust the pressure in the chamber 50 to a desired value, and sends control signals to the stage heater 51 so as to adjust the temperature of the wafer W to a desired temperature. Moreover, at this time, the pressure gauge 66 sends the value of the pressure in the chamber 50 to the CPU of the EC 89 in the form of an output signal, and the CPU determines control parameters for the APC valve 69, and the MFC in the nitrogen gas supply pipe 65 based on the sent value of the pressure in the chamber 50.

According to the system controller shown in FIG. 5, the plurality of end devices are not directly connected to the EC 89, but rather the I/O units 100 which are connected to the plurality of end devices are modularized to form the I/O modules, and each I/O module is connected to the EC 89 via an MC and the switching hub 93. As a result, the communication system can be simplified.

Moreover, each of the control signals sent by the CPU of the EC 89 contains the address of the I/O unit 100 connected to the desired end device, and the address of the I/O module containing that I/O unit 100. The switching hub 93 thus refers to the address of the I/O module in the control signal, and then the GHOST of the appropriate MC refers to the address of the I/O unit 100 in the control signal, whereby the need for the switching hub 93 or the MC to ask the CPU for the destination of the control signal can be eliminated, and hence smoother transmission of the control signals can be realized.

As described earlier, a surface damaged layer having similar properties to $SiO_2$ (hereinafter referred to as a "pseudo-$SiO_2$ layer") is formed by RIE or ashing on a surface of a carbon-doped SiOC type low dielectric constant interlayer insulating film or organic polymer type coated low dielectric constant interlayer insulating film formed on a wafer W. Such a pseudo-$SiO_2$ layer is a causal factor in various problems with electronic devices manufactured from such a wafer W, and hence must be removed. Note that such a pseudo-SiO$_2$ layer is also known as an "altered layer" or a "sacrificial layer".

In the method of processing a substrate according to the present embodiment, to achieve this, a wafer W having thereon a low dielectric constant interlayer insulating film having a pseudo-SiO$_2$ layer formed on a surface thereof is subjected to the COR processing and the PHT processing.

The COR processing is processing in which an oxide film on an object to be processed is made to undergo chemical reaction with gas molecules to produce a product, and the PHT processing is processing in which the object to be processed that has been subjected to the COR processing is heated so as to vaporize/thermally oxidize the product that has been produced on the object to be processed through the chemical reaction in the COR processing, thus removing the product from the substrate. As described above, the COR processing and also the PHT processing are (particularly the COR processing is) processing in which the oxide film on the object to be processed can be removed without using plasma and without using water, and hence are categorized as plasma-less etching or dry cleaning.

In the method of processing a substrate according to the present embodiment, ammonia gas and hydrogen fluoride gas are used as the gas. Here, the hydrogen fluoride gas promotes corrosion of the pseudo-SiO$_2$ layer, and the ammonia gas is involved in synthesis of a reaction by-product for restricting, and ultimately stopping, the reaction between the oxide film and the hydrogen fluoride gas as required. Specifically, the following chemical reactions are used in the COR processing and the PHT processing.

(COR Processing)

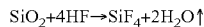

$$SiO_2+4HF \rightarrow SiF_4+2H_2O\uparrow$$

$$SiF_4+2NH_3+2HF \rightarrow (NH_4)_2SiF_6$$

(PHT Processing)

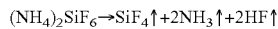

$$(NH_4)_2SiF_6 \rightarrow SiF_4\uparrow+2NH_3\uparrow+2HF\uparrow$$

It has been found by the present inventors that the COR processing and PHT processing using the above chemical reactions exhibit the following characteristics. Incidentally, small amounts of N$_2$ and H$_2$ are also produced in the PHT processing.

1) Selectivity (Removal Rate) for Thermal Oxide Film is High

Specifically, according to the COR processing and PHT processing, the selectivity for a thermal oxide film is high, whereas the selectivity for silicon is low. The pseudo-SiO$_2$ layer, which has similar properties to an SiO$_2$ film which is a thermal oxide film, can thus be removed efficiently.

2) Rate of Growth of Native Oxide Film on Surface of Low Dielectric Constant Interlayer Insulating Film from Which Oxide Film has Been Removed is Slow Specifically, the time taken for growth of a native oxide film of thickness 3 Å on the surface of a low dielectric constant interlayer insulating film from which an oxide film has been removed by wet etching is 10 minutes, whereas the time taken for growth of a native oxide film of thickness 3 Å on the surface of a low dielectric constant interlayer insulating film from which an oxide film has been removed by the COR processing and the PHT processing is over 2 hours. There is thus no unwanted oxide film formation in an electronic device manufacturing process, and hence the reliability of the electronic device can be improved.

3) Reaction Proceeds in Dry Environment

Specifically, water is not used in the reaction in the COR processing, and moreover any water produced through the COR processing is vaporized in the PHT processing. There are thus no OH groups on the surface of the low dielectric constant interlayer insulating film from which the oxide film has been removed. The surface of the low dielectric constant interlayer insulating film thus does not become hydrophilic, and hence the surface does not absorb moisture. A decrease in electronic device wiring reliability can thus be prevented.

4) Amount Produced of Product Levels Off After a Certain Time has Elapsed

Specifically, once a certain time has elapsed, even if the pseudo-SiO$_2$ layer continues to be exposed to the mixed gas of ammonia gas and hydrogen fluoride gas beyond this, there is no further increase in the amount produced of the product. Moreover, the amount produced of the product is determined by parameters of the mixed gas such as the pressure of the mixed gas and the volumetric flow rate ratio. Control of the amount removed of the pseudo-SiO$_2$ layer can thus be carried out easily.

5) Very Little Particle Formation

Specifically, even upon implementing pseudo-SiO$_2$ layer removal for 2000 wafers W in the second processing unit 34 and the third processing unit 36, hardly any attachment of particles to the inner wall of the chamber 38 or the chamber 50 is observed. Problems due to particles such as short-circuiting of the electronic device wiring thus does not occur, and hence the reliability of the electronic device can be improved.

In the method of processing a substrate according to the present embodiment, using the substrate processing apparatus 10, first, a wafer W having thereon a low dielectric constant interlayer insulating film having a pseudo-SiO$_2$ layer formed on the surface thereof is housed in the chamber 38 of the second processing unit 34, the pressure in the chamber 38 is adjusted to a predetermined pressure, ammonia gas, hydrogen fluoride gas, and argon (Ar) gas as a diluent gas are introduced into the chamber 38 to produce an atmosphere of a mixed gas comprised of ammonia gas, hydrogen fluoride gas and argon gas in the chamber 38, and the pseudo-SiO$_2$ layer is exposed to the mixed gas under the predetermined pressure (surface damaged layer exposure step). As a result, a product having a complex structure is produced from the pseudo-SiO$_2$ layer, the ammonia gas and the hydrogen fluoride gas.

Next, the wafer W on which the product has been produced is mounted on the stage heater 51 in the chamber 50 of the third processing unit 36, the pressure in the chamber 50 is adjusted to a predetermined pressure, nitrogen gas is introduced into the chamber 50 to produce viscous flow, and the wafer W is heated to a predetermined temperature using the stage heater 51 (surface damaged layer heating step). As a result, the complex structure of the product is thermally decomposed, the product being separated into silicon tetrafluoride (SiF$_4$), ammonia and hydrogen fluoride, which are vaporized. The vaporized molecules are entrained in the viscous flow, and thus discharged from the chamber 50 by the third processing unit exhaust system 67.

In the second processing unit 34, because hydrogen fluoride gas readily reacts with moisture, it is preferable to set the volume of the ammonia gas to be greater than the volume of the hydrogen fluoride gas in the chamber 38, and moreover it is preferable to remove water molecules from the chamber 38 as much as possible. Specifically, the volumetric flow rate (SCCM) ratio of the hydrogen fluoride gas to the ammonia gas in the mixed gas in the chamber 38 is preferably in a range of 1 to ½, and moreover the predetermined pressure in the chamber 38 is preferably in a range of $6.7 \times 10^{-2}$ to 4.0 Pa (0.5 to 30 mTorr). As a result, the flow rate ratio for the mixed gas in the chamber 38 and so on is stabilized, and hence production of the product can be promoted.

Moreover, if the predetermined pressure in the chamber 38 is in a range of $6.7 \times 10^{-2}$ to 4.0 Pa (0.5 to 30 mTorr), then the amount produced of the product can be made to level off reliably after a certain time has elapsed, whereby the etching depth can be reliably controlled (i.e. is self-limited). For example, in the case that the predetermined pressure in the chamber 38 is 1.3 Pa (10 mTorr), the etching stops proceeding after approximately 3 minutes has elapsed from commencement of the COR processing, and the etching depth at this time is approximately 15 nm. Moreover, in the case that the predetermined pressure in the chamber 38 is 2.7 Pa (20 mTorr), the etching stops proceeding after approximately 3 minutes has elapsed from commencement of the COR processing, and the etching depth at this time is approximately 24 nm.

Moreover, the reaction to produce the product is promoted at around room temperature, and hence the temperature of the ESC 39 on which the wafer W is mounted is preferably set to 25° C. using the temperature adjusting mechanism (not shown) built therein. Furthermore, the higher the temperature, the less prone by-products formed in the chamber 38 are to become attached to the inner wall of the chamber 38, and hence the temperature of the inner wall of the chamber 38 is preferably set to 50° C. using the heater (not shown) embedded in the side wall of the chamber 38.

The product of the reaction is a complex compound containing coordinate bonds. Such a complex compound is weakly bonded together, and hence undergoes thermal decomposition even at a relatively low temperature. In the third processing unit 36, the predetermined temperature of the wafer W is thus preferably in a range of 80 to 200° C., and furthermore the time for which the wafer W is subjected to the PHT processing is preferably in a range of 60 to 180 seconds. Moreover, to produce viscous flow in the chamber 50, it is undesirable to make the degree of vacuum in the chamber 50 high, and moreover a gas flow of a certain flow rate is required. The predetermined pressure in the chamber 50 is thus preferably in a range of $6.7 \times 10$ to $1.3 \times 10^2$ Pa (500 mTorr to 1 Torr), and the nitrogen gas flow rate is preferably in a range of 500 to 3000 SCCM. As a result, viscous flow can be produced reliably in the chamber 50, and hence gas molecules produced through the thermal decomposition of the product can be reliably removed.

Moreover, before subjecting each wafer W to the COR processing, it is preferable to measure the CD value of a wiring groove or contact hole (connecting hole) in the low dielectric constant interlayer insulating film having the pseudo-$SiO_2$ layer thereon using the first IMS 17, and in accordance with the measured CD value, for the CPU of the EC 89 to decide the values of processing condition parameters in the COR processing and PHT processing based on a predetermined relationship between the CD value and processing condition parameters relating to the amount removed of the pseudo-$SiO_2$ layer (product production condition deciding step). As a result, the amount removed of the pseudo-$SiO_2$ layer can be controlled precisely, and hence the efficiency of the substrate surface processing can be improved.

The above predetermined relationship is set based on the difference in the CD value between before and after carrying out the COR processing and PHT processing as measured by the first IMS 17 at the start of a lot in which a plurality of wafers W are to be processed, i.e. the amount removed of the pseudo-$SiO_2$ layer by the COR processing and PHT processing, and the processing condition parameters in the COR processing and PHT processing at this time. Examples of the processing condition parameters include the volumetric flow rate ratio of the hydrogen fluoride gas to the ammonia gas, the predetermined pressure in the chamber 38, and the heating temperature of the wafer W mounted on the stage heater 51. The predetermined relationship thus set is stored in the HDD of the EC 89 or the like, and is referred to as described above when processing subsequent wafers W in the lot.

Moreover, whether or not to re-perform the COR processing and PHT processing on a wafer W may be decided based on the difference in the CD value between before and after performing the COR processing and PHT processing on that wafer W, and furthermore in the case that it is decided to re-perform the COR processing and PHT processing, the CPU of the EC 89 may decide the processing condition parameters for the COR processing and PHT processing based on the above predetermined relationship in accordance with the CD value after carrying out the COR processing and PHT processing on the wafer W in question the first time.

According to the method of processing a substrate of the present embodiment, a wafer W having thereon a low dielectric constant interlayer insulating film having a pseudo-$SiO_2$ layer formed on a surface thereof is exposed to an atmosphere of a mixed gas comprised of ammonia gas, hydrogen fluoride gas and argon gas under a predetermined pressure, and then the wafer W that has been exposed to the atmosphere of the mixed gas is heated to a predetermined temperature. As a result, a product having a complex structure is produced from the pseudo-$SiO_2$ layer, the ammonia gas and the hydrogen fluoride gas, and then the complex structure of the product is thermally decomposed, the product being separated into silicon tetrafluoride ($SiF_4$), ammonia and hydrogen fluoride, which are vaporized. The pseudo-$SiO_2$ layer can thus be removed without using a liquid chemical, and hence there are no OH groups on the surface of the low dielectric constant interlayer insulating film from which the pseudo-$SiO_2$ layer has been removed. Moreover, the amount produced of the product levels off after a certain time has elapsed, the amount produced of the product being determined by parameters of the mixed gas. Control of the amount removed of the pseudo-$SiO_2$ layer can thus be carried out easily, and a decrease in wiring reliability in an electronic device manufactured from the wafer W can be prevented.

Moreover, according to the method of processing a substrate of the present embodiment, the pseudo-$SiO_2$ layer on the surface of the low dielectric constant interlayer insulating film is removed by subjecting the wafer W to plasma-less etching. As a result, charge is not accumulated on a gate electrode in an electronic device manufactured from the wafer W, and hence degradation or destruction of a gate oxide film can be prevented. Moreover, the electronic device is not irradiated with energetic particles, and hence semiconductor crystal defects can be prevented from occurring. Furthermore, unanticipated chemical reactions caused by plasma do not occur, and hence generation of impurities can be prevented, whereby contamination of the chamber 38 and the chamber 50 can be prevented.

Furthermore, according to the method of processing a substrate of the present embodiment, the pseudo-$SiO_2$ layer on the surface of the low dielectric constant interlayer insulating film is removed by subjecting the wafer W to dry cleaning. As a result, changes in properties of the surface of the wafer W can be suppressed, and hence a decrease in wiring reliability in an electronic device manufactured from the wafer W can be reliably prevented.

Next, a method of manufacturing an electronic device according to an embodiment of the present invention will be described.

In the method of manufacturing an electronic device according to the present embodiment, a pseudo-$SiO_2$ layer formed on a surface of a low dielectric constant interlayer insulating film is removed using the COR processing and PHT processing as described above. The COR processing and the PHT processing are implemented in the second process ship 12 of the substrate processing apparatus 10.

FIGS. 6A to 6F constitute a process diagram showing the method of manufacturing an electronic device according to the present embodiment.

Figure 6A:
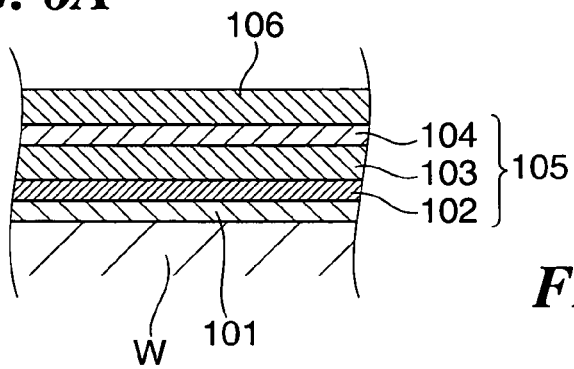
FIGS. 6A to 6F constitute a process diagram showing a method of manufacturing an electronic device according to an embodiment of the present invention.
Figure 6B:
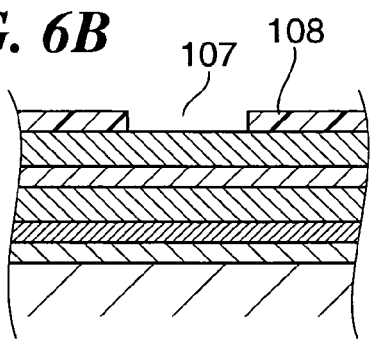

As shown in FIGS. 6A to 6F, first, a capacitor 105 comprised of a lower electrode 102, a capacitive insulating film 103 and an upper electrode 104 is formed on a silicon oxide ($SiO_2$) film 101 that has been formed by thermal oxidation on a surface of a silicon wafer W, and then an SiOC type low dielectric constant interlayer insulating film material is deposited by CVD, or an organic polymer type coated low dielectric constant interlayer insulating film material is deposited by an SOD (spin-on dielectric) method, so as to form a low dielectric constant interlayer insulating film 106 on the capacitor 105 (low dielectric constant insulating film formation step) (FIG. 6A).

Figure 6C:
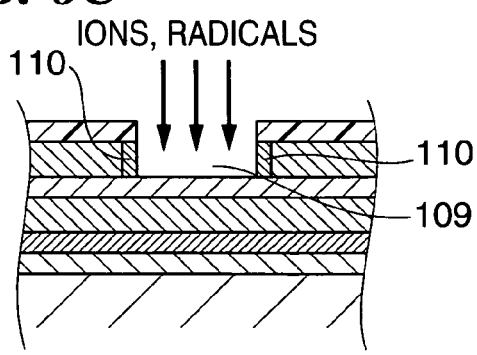

Next, a photoresist layer 108 patterned such as to have therein an opening 107 through which part of the low dielectric constant interlayer insulating film 106 will be exposed is formed by lithography (photoresist layer formation step) (FIG. 6B), and then using the formed photoresist layer 108 as a mask, the low dielectric constant interlayer insulating film 106 is etched by RIE using ions and radicals produced by forming plasma from a processing gas (e.g. a mixed gas comprised of a fluorocarbon ($C_4F_8$) gas, oxygen ($O_2$) gas, and argon gas in a predetermined flow rate ratio), thus fabricating in the low dielectric constant interlayer insulating film 106 a via hole (connecting hole) 109 that reaches the upper electrode 104 (plasma fabrication step) (FIG. 6C). At this time, a surface of the via hole 109 at the low dielectric constant interlayer insulating film 106 is covered by a pseudo-$SiO_2$ layer 110 produced due to the RIE.

Figure 6D:
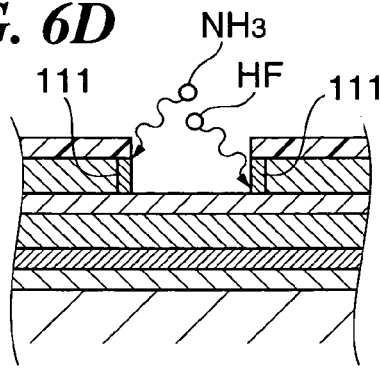

After that, the wafer W is housed in the chamber 38 of the second processing unit 34, and the surface of the via hole 109 covered by the pseudo-$SiO_2$ layer 110 is exposed to an atmosphere of a mixed gas comprised of ammonia gas, hydrogen fluoride gas and argon gas under a predetermined pressure (connecting hole surface exposure step), thus producing a product 111 having a complex structure from the pseudo-$SiO_2$ layer 110, the ammonia gas and the hydrogen fluoride gas on the surface of the via hole 109 (FIG. 6D).

Figure 6E:
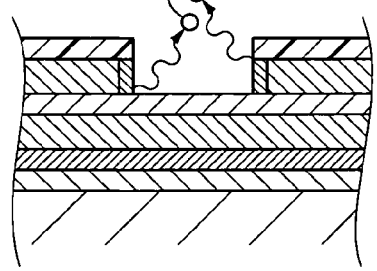
Figure 6F:
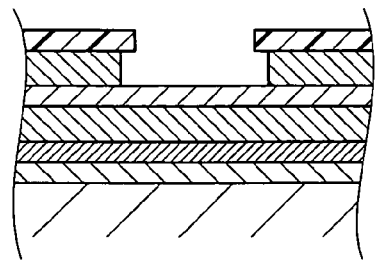

Next, the wafer W on which the product 111 has been produced is mounted on the stage heater 51 in the chamber 50 of the third processing unit 36, and the surface of the via hole 109, and hence the product 111, is heated to a predetermined temperature (connecting hole surface heating step), whereby the complex structure of the product 111 is decomposed, the product 111 being separated into silicon tetrafluoride, ammonia and hydrogen fluoride, which are vaporized (FIG. 6E). As a result, the pseudo-$SiO_2$ layer 110 on the surface of the via hole 109 is removed (FIG. 6F).

According to the method of manufacturing an electronic device of the present embodiment, the surface of the via hole 109 covered by the pseudo-$SiO_2$ layer 110 produced due to the RIE is exposed to an atmosphere of a mixed gas comprised of ammonia gas, hydrogen fluoride gas and argon gas under a predetermined pressure, and then the surface of the via hole 109 is heated to a predetermined temperature. Upon the pseudo-$SiO_2$ layer 110 being exposed to the atmosphere of the mixed gas comprised of ammonia gas, hydrogen fluoride gas and argon gas under the predetermined pressure, a product 111 based on the pseudo-$SiO_2$ layer 110, the ammonia gas and the hydrogen fluoride gas is produced, and then upon the produced product 111 being heated to the predetermined temperature, the product 111 is vaporized. The pseudo-$SiO_2$ layer 110 on the surface of the via hole 109 can thus be removed without using a liquid chemical. Moreover, the amount produced of the product 111 can be controlled through parameters of the mixed gas. Control of the amount removed of the pseudo-$SiO_2$ layer 110 from the surface of the via hole 109 can thus be carried out easily, and a decrease in wiring reliability in the electronic device can be prevented.

FIGS. 7A to 7J constitute a process diagram showing a first variation of the method of manufacturing an electronic device according to the present embodiment.

Figure 7A:
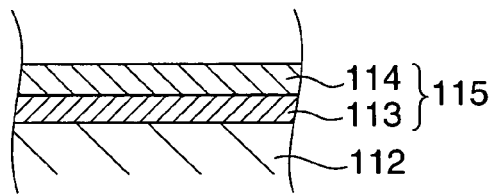
FIGS. 7A to 7J constitute a process diagram showing a first variation of the method of manufacturing an electronic device according to the above embodiment.
Figure 7B:
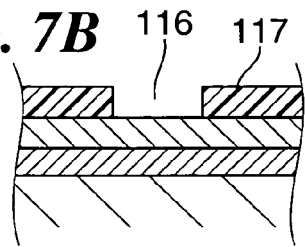

As shown in FIGS. 7A to 7J, first, an SiOC type low dielectric constant interlayer insulating film material or an organic polymer type coated low dielectric constant interlayer insulating film material is deposited so as to form a low dielectric constant interlayer insulating film 113 on a polysilicon layer 112 formed on a surface of a silicon wafer W, and then a silicon oxide film 114 (other insulating film) is formed on the low dielectric constant interlayer insulating film 113, thus forming an interlayer insulating film 115 (interlayer insulating film formation step) (FIG. 7A).

Figure 7C:
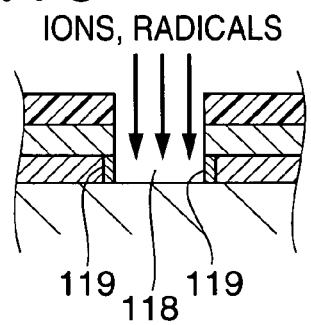

Next, a photoresist layer 117 patterned such as to have therein an opening 116 through which part of the insulating film 115 will be exposed is formed by lithography (photoresist layer formation step) (FIG. 7B), and then using the formed photoresist layer 117 as a mask, the interlayer insulating film 115 is etched by RIE, thus fabricating a wiring groove 118 in the interlayer insulating film 115 (plasma fabrication step) (FIG. 7C). At this time, a surface of the wiring groove 118 at the low dielectric constant interlayer insulating film 113 is covered by a pseudo-$SiO_2$ layer 119 produced due to the RIE.

Figure 7D:
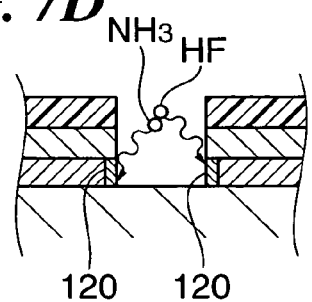

After that, the wafer W is housed in the chamber 38 of the second processing unit 34, and at least the surface at the low dielectric constant interlayer insulating film 113 is exposed to an atmosphere of a mixed gas comprised of ammonia gas, hydrogen fluoride gas and argon gas under a predetermined pressure (wiring groove surface exposure step), thus producing a product 120 having a complex structure from the pseudo-$SiO_2$ layer 119, the ammonia gas and the hydrogen fluoride gas on the surface at the low dielectric constant interlayer insulating film 113 (FIG. 7D).

Figure 7E:
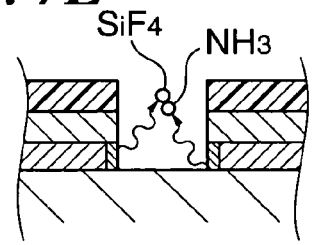
Figure 7F:
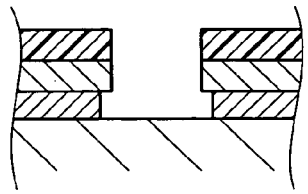
Figure 7G:
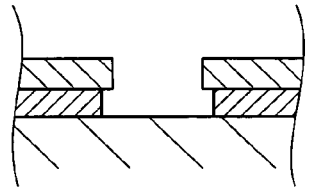

Next, the wafer W on which the product 120 has been produced is mounted on the stage heater 51 in the chamber 50 of the third processing unit 36, and the surface of the wiring groove 118, and hence the product 120, is heated to a predetermined temperature (wiring groove surface heating step), whereby the complex structure of the product 120 is decomposed, the product 120 being separated into silicon tetrafluoride, ammonia and hydrogen fluoride, which are vaporized (FIG. 7E). As a result, the pseudo-$SiO_2$ layer 119 on the surface of the wiring groove 118 is removed (FIG. 7F).

Figure 7H:
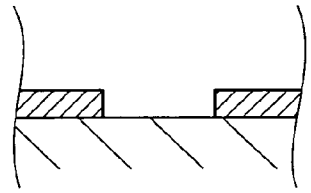
Figure 7I:
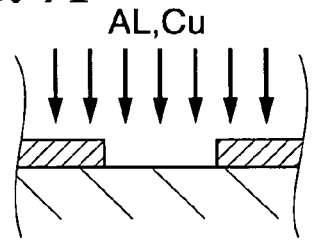

Next, the photoresist layer 117 is removed (ashing step) (FIG. 7G), and then the silicon oxide film 114 on the low dielectric constant interlayer insulating film 113 is removed by wet etching or the like (other insulating film removal step) (FIG. 7H). For the removal of the photoresist layer 117, if the photoresist layer 117 is made of silicon oxide ($SiO_2$), then the photoresist layer 117 may alternatively be removed by exposing the photoresist layer 117 to the atmosphere of the mixed gas comprised of ammonia gas, hydrogen fluoride gas and argon gas so as to produce a product having a complex structure from the photoresist layer 117, the ammonia gas and the hydrogen fluoride gas (COR processing), and then heating the product so as to decompose the complex structure of the product, the product being separated into silicon tetrafluoride, ammonia and hydrogen fluoride, which are vaporized (PHT processing). As a result, the photoresist layer 117 can be removed without using a liquid chemical or plasma. Moreover, the amount removed of the photoresist layer 117 can be controlled through parameters of the mixed gas, and hence formation of residue from the photoresist layer 117 and unnecessary etching of the silicon oxide film 114 can be prevented.

Figure 7J:
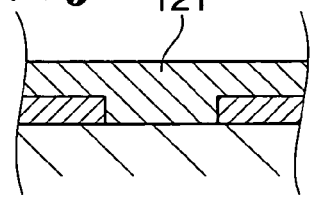

A conductive film made of a wiring material such as copper (Cu) or aluminum (Al) is further formed over the whole of the wafer W by CVD or PVD (physical vapor deposition), thus introducing the wiring material into the wiring groove 118 (FIG. 7I), whereby wiring 121 is formed (wiring formation step) (FIG. 7J).

According to the first variation of the method of manufacturing an electronic device of the present embodiment, the surface of the wiring groove 118 at the low dielectric constant interlayer insulating film 113 covered by the pseudo-$SiO_2$ layer 119 produced due to the RIE is exposed to an atmosphere of a mixed gas comprised of ammonia gas, hydrogen fluoride gas and argon gas under a predetermined pressure, and then the surface of the wiring groove 118 is heated to a predetermined temperature. Upon the pseudo-$SiO_2$ layer 119 being exposed to the atmosphere of the mixed gas comprised of ammonia gas, hydrogen fluoride gas and argon gas under the predetermined pressure, the product 120 based on the pseudo-$SiO_2$ layer 119, the ammonia gas and the hydrogen fluoride gas is produced, and then upon the produced product 120 being heated to the predetermined temperature, the product 120 is vaporized. The pseudo-$SiO_2$ layer 119 on the surface of the wiring groove 118 at the low dielectric constant interlayer insulating film 113 can thus be removed without using a liquid chemical. Moreover, the amount produced of the product 120 can be controlled through parameters of the mixed gas. Control of the amount removed of the pseudo-$SiO_2$ layer 119 from the surface of the wiring groove 118 at the low dielectric constant interlayer insulating film 113 can thus be carried out easily, and a decrease in wiring reliability in the electronic device can be prevented.

FIGS. 8A to 8I constitute a process diagram showing a second variation of the method of manufacturing an electronic device according to the present embodiment.

As shown in FIGS. 8A to 8I, first, a polysilicon layer 122 is formed as a conductive film on a surface of a silicon wafer W (conductive film formation step), and then an SiOC type low dielectric constant interlayer insulating film material or an organic polymer type coated low dielectric constant interlayer insulating film material is deposited so as to form a low dielectric constant interlayer insulating film 123 on the polysilicon layer 122 (low dielectric constant insulating film formation step) (FIG. 8A).

Next, a photoresist layer 125 patterned such as to have therein an opening 124 through which part of the low dielectric constant interlayer insulating film 123 will be exposed is formed by lithography (photoresist layer formation step) (FIG. 8B), and then using the formed photoresist layer 125 as a mask, the low dielectric constant interlayer insulating film 123 is etched by RIE, thus fabricating in the low dielectric constant interlayer insulating film 123 a contact hole (connecting hole) 126 that reaches the polysilicon layer 122 (plasma fabrication step) (FIG. 8C). At this time, the surface of the contact hole 126 at the low dielectric constant interlayer insulating film 123 is covered by a pseudo-$SiO_2$ layer 127 produced due to the RIE.

After that, the wafer W is housed in the chamber 38 of the second processing unit 34, and the surface of the contact hole 126 covered by the pseudo-$SiO_2$ layer 127 is exposed to an atmosphere of a mixed gas comprised of ammonia gas, hydrogen fluoride gas and argon gas under a predetermined pressure (connecting hole surface exposure step), thus producing a product 128 having a complex structure from the pseudo-$SiO_2$ layer 127, the ammonia gas and the hydrogen fluoride gas on the surface of the contact hole 126 (FIG. 8D).

Next, the wafer W on which the product 128 has been produced is mounted on the stage heater 51 in the chamber 50 of the third processing unit 36, and the surface of the contact hole 126, and hence the product 128, is heated to a predetermined temperature (connecting hole surface heating step), whereby the complex structure of the product 128 is decomposed, the product 128 being separated into silicon tetrafluoride, ammonia and hydrogen fluoride, which are vaporized (FIG. 8E). As a result, the pseudo-$SiO_2$ layer 127 on the surface of the contact hole 126 is removed (FIG. 8F).

Next, the photoresist layer 125 is removed (ashing step) (FIG. 8G), and then a conductive film made of a wiring material such as copper or aluminum is formed over the whole of the wafer W by CVD or PVD, thus introducing the wiring material into the contact hole 126 (FIG. 8H), whereby wiring 129 is formed (wiring formation step) (FIG. 8I).

According to the second variation of the method of manufacturing an electronic device of the present embodiment, the surface of the contact hole 126 covered by the pseudo-$SiO_2$ layer 127 produced due to the RIE is exposed to an atmosphere of a mixed gas comprised of ammonia gas, hydrogen fluoride gas and argon gas under a predetermined pressure, and then the surface of the contact hole 126 is heated to a predetermined temperature. Upon the pseudo-$SiO_2$ layer 127 being exposed to the atmosphere of the mixed gas comprised of ammonia gas, hydrogen fluoride gas and argon gas under the predetermined pressure, the product 128 based on the pseudo-$SiO_2$ layer 127, the ammonia gas and the hydrogen fluoride gas is produced, and then upon the produced product 128 being heated to the predetermined temperature, the product 128 is vaporized. The pseudo-$SiO_2$ layer 127 on the surface of the contact hole 126 can thus be removed without using a liquid chemical. Moreover, the amount produced of the product 128 can be controlled through parameters of the mixed gas. Control of the amount removed of the pseudo-$SiO_2$ layer 127 from the surface of the contact hole 126 can thus be carried out easily, and a decrease in wiring reliability in the electronic device can be prevented.

FIGS. 9A to 9H constitute a process diagram showing a third variation of the method of manufacturing an electronic device according to the present embodiment.

Figure 9A:
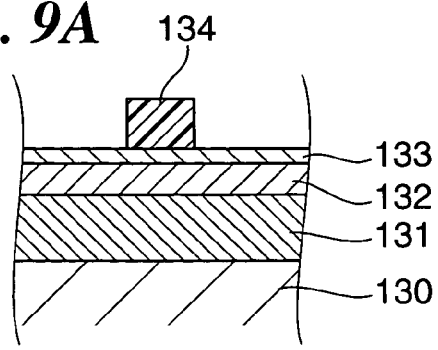
FIGS. 9A to 9H constitute a process diagram showing a third variation of the method of manufacturing an electronic device according to the above embodiment.
Figure 9B:
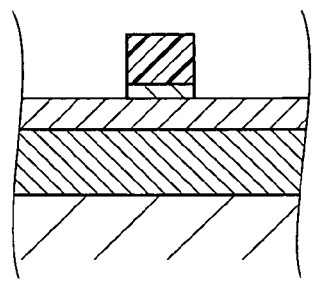
Figure 9C:
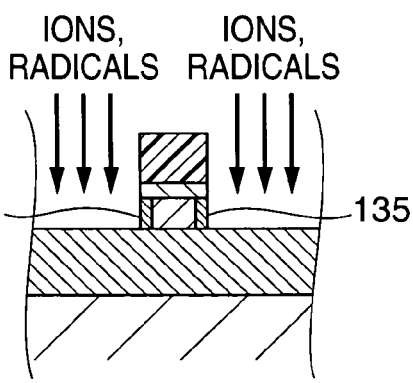

As shown in FIGS. 9A to 9H, first, a silicon oxide film 130, a polysilicon layer 131, a TEOS layer 132 made of TEOS (tetraethyl orthosilicate, $Si(OCH_2CH_3)_4$) as a low dielectric constant interlayer insulating film material, and a BARC (bottom anti-reflection coating) layer 133 as an anti-reflection film made of a nitride are formed in this order from the bottom upward on a surface of a silicon wafer W, and then a photoresist layer 134 patterned so as to correspond to a desired gate shape is formed by lithography on the BARC layer 133 (FIG. 9A).

Figure 9D:
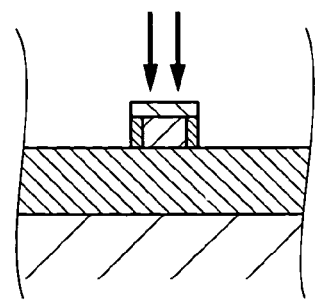

Next, using the formed photoresist layer 134 as a mask, first, parts of the BARC layer 133 not covered by the photoresist layer 134 are removed by etching or the like (FIG. 9B), and parts of the TEOS layer 132 not covered by the photoresist layer 134 are removed by RIE, so as to expose the polysilicon layer 131 other than in places directly below the photoresist layer 134 (FIG. 9C), and then the photoresist layer 134 is removed (FIG. 9D). At this time, exposed surfaces (side surfaces) of the TEOS layer 132 are covered by a pseudo-SiO$_2$ layer 135 produced due to the RIE.

Figure 9E:
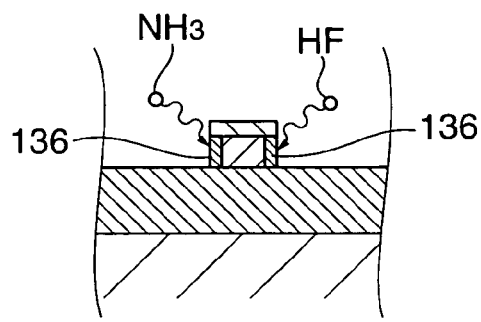

After that, the wafer W is housed in the chamber 38 of the second processing unit 34, and the exposed surfaces of the TEOS layer 132 covered by the pseudo-SiO$_2$ layer 135 are exposed to an atmosphere of a mixed gas comprised of ammonia gas, hydrogen fluoride gas and argon gas under a predetermined pressure, thus producing a product 136 having a complex structure from the pseudo-SiO$_2$ layer 135, the ammonia gas and the hydrogen fluoride gas on the exposed surfaces of the TEOS layer 132 (FIG. 9E).

Figure 9F:
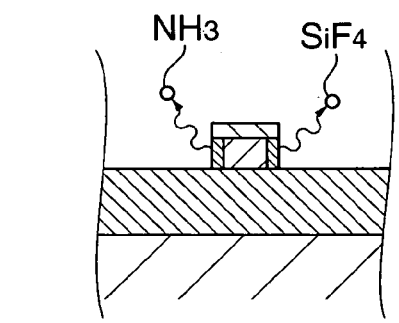
Figure 9G:
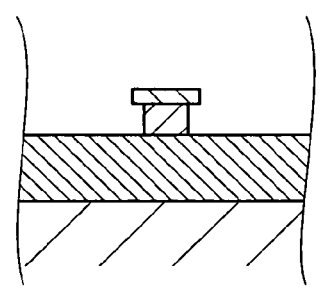

Next, the wafer W on which the product 136 has been produced is mounted on the stage heater 51 in the chamber 50 of the third processing unit 36, and the exposed surfaces of the TEOS layer 132 are, and hence the product 136 is, heated to a predetermined temperature, whereby the complex structure of the product 136 is decomposed, the product 136 being separated into silicon tetrafluoride, ammonia and hydrogen fluoride, which are vaporized (FIG. 9F). As a result, the pseudo-SiO$_2$ layer 135 on the exposed surfaces of the TEOS layer 132 is removed, and hence the TEOS layer 132 is trimmed (FIG. 9G).

Figure 9H:
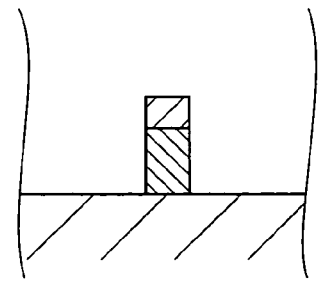

Next, the BARC layer 133 is removed from the trimmed TEOS layer 132, and then parts of the polysilicon layer 131 not covered by the trimmed TEOS layer 132 are removed by etching or the like. As a result, a gate is formed on the wafer W (FIG. 9H).

According to the third variation of the method of manufacturing an electronic device of the present embodiment, the exposed surfaces of the TEOS layer 132 covered by the pseudo-SiO$_2$ layer 135 produced due to the RIE are exposed to an atmosphere of a mixed gas comprised of ammonia gas, hydrogen fluoride gas and argon gas under a predetermined pressure, and then the exposed surfaces of the TEOS layer 132 are heated to a predetermined temperature. Upon the pseudo-SiO$_2$ layer 135 being exposed to the atmosphere of the mixed gas comprised of ammonia gas, hydrogen fluoride gas and argon gas under the predetermined pressure, the product 136 based on the pseudo-SiO$_2$ layer 135, the ammonia gas and the hydrogen fluoride gas is produced, and then upon the produced product 136 being heated to the predetermined temperature, the product 136 is vaporized. The pseudo-SiO$_2$ layer 135 on the exposed surfaces of the TEOS layer 132 can thus be removed without using a liquid chemical. Moreover, the amount produced of the product 136 can be controlled through parameters of the mixed gas. Control of the amount removed of the pseudo-SiO$_2$ layer 135 from the exposed surfaces of the TEOS layer 132 can thus be carried out easily, and a decrease in wiring reliability in the electronic device can be prevented.

In the method of manufacturing an electronic device according to the present embodiment and each of the variations thereof described above, before removing the pseudo-SiO$_2$ layer, it is preferable to transfer the wafer W into the first IMS 17, and measure the CD value of the surface of the via hole 109, the wiring groove 118 or the contact hole 126, or of the exposed surfaces of the TEOS layer 132, and in accordance with the measured CD value, for the CPU of the EC 89 to decide target values of processing condition parameters relating to the amount removed of the pseudo-SiO$_2$ layer, such as the volumetric flow rate ratio of the hydrogen fluoride gas to the ammonia gas, the predetermined pressure in the chamber 38, and the heating temperature of the wafer W mounted on the stage heater 51, based on a predetermined relationship between the CD value and these processing condition parameters. As a result, the amount removed of the pseudo-SiO$_2$ layer can be controlled precisely, and hence the efficiency of the manufacture of the electronic device can be improved.

Moreover, whether or not to re-perform the pseudo-SiO$_2$ layer removal may be decided based on the difference in the CD value of the surface of the via hole 109 or the like between before and after performing the pseudo-SiO$_2$ layer removal, and furthermore in the case that it is decided to re-perform the pseudo-SiO$_2$ layer removal, the CPU of the EC 89 may decide the volumetric flow rate ratio of the hydrogen fluoride gas to the ammonia gas and so on based on the above predetermined relationship in accordance with the CD value of the via hole 109 or the like after carrying out the pseudo-SiO$_2$ layer removal the first time.

Figure 10:
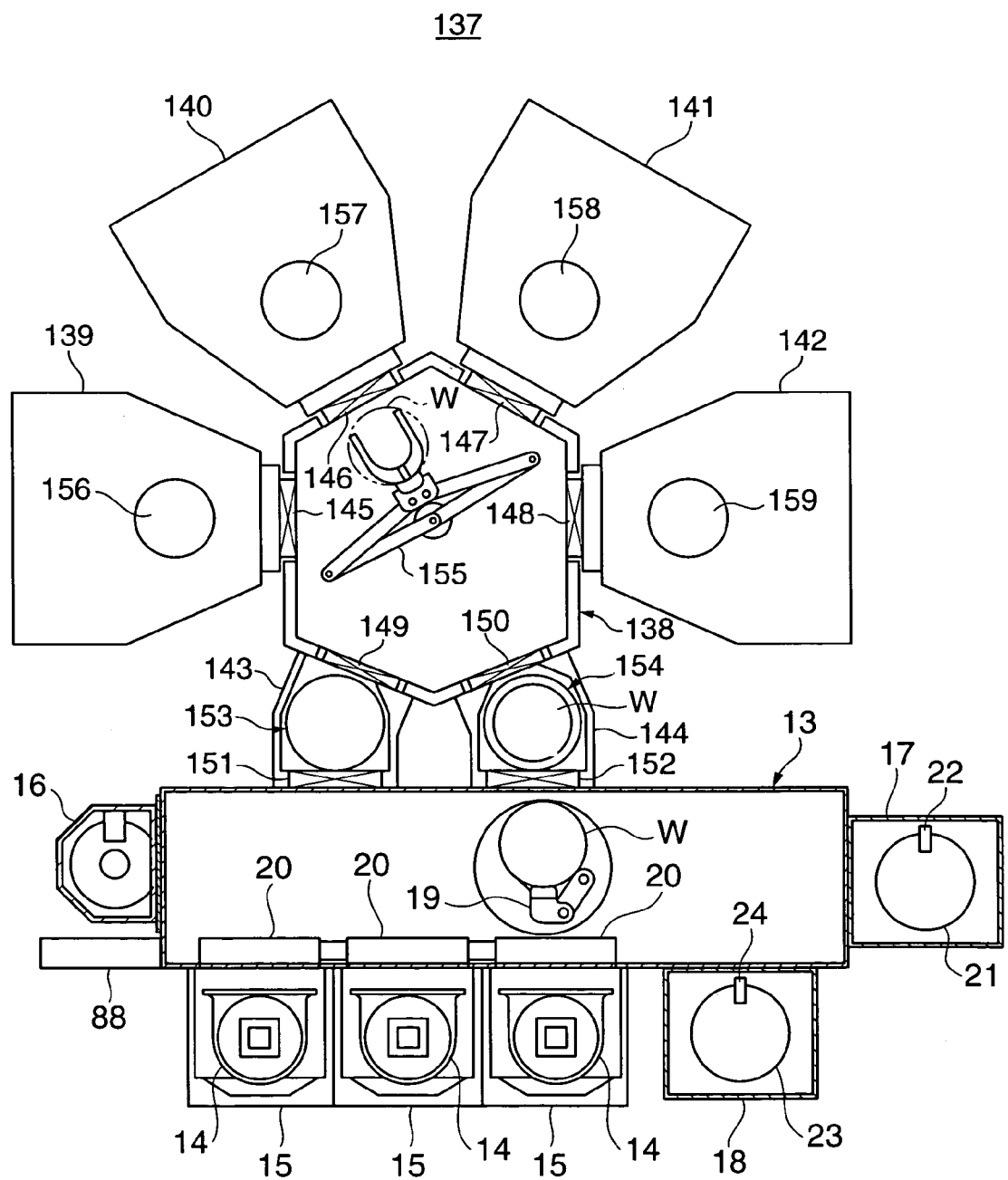
FIG. 10 is a plan view schematically showing the construction of a first variation of the substrate processing apparatus to which is applied the method of processing a substrate according to the above embodiment.
Figure 11:
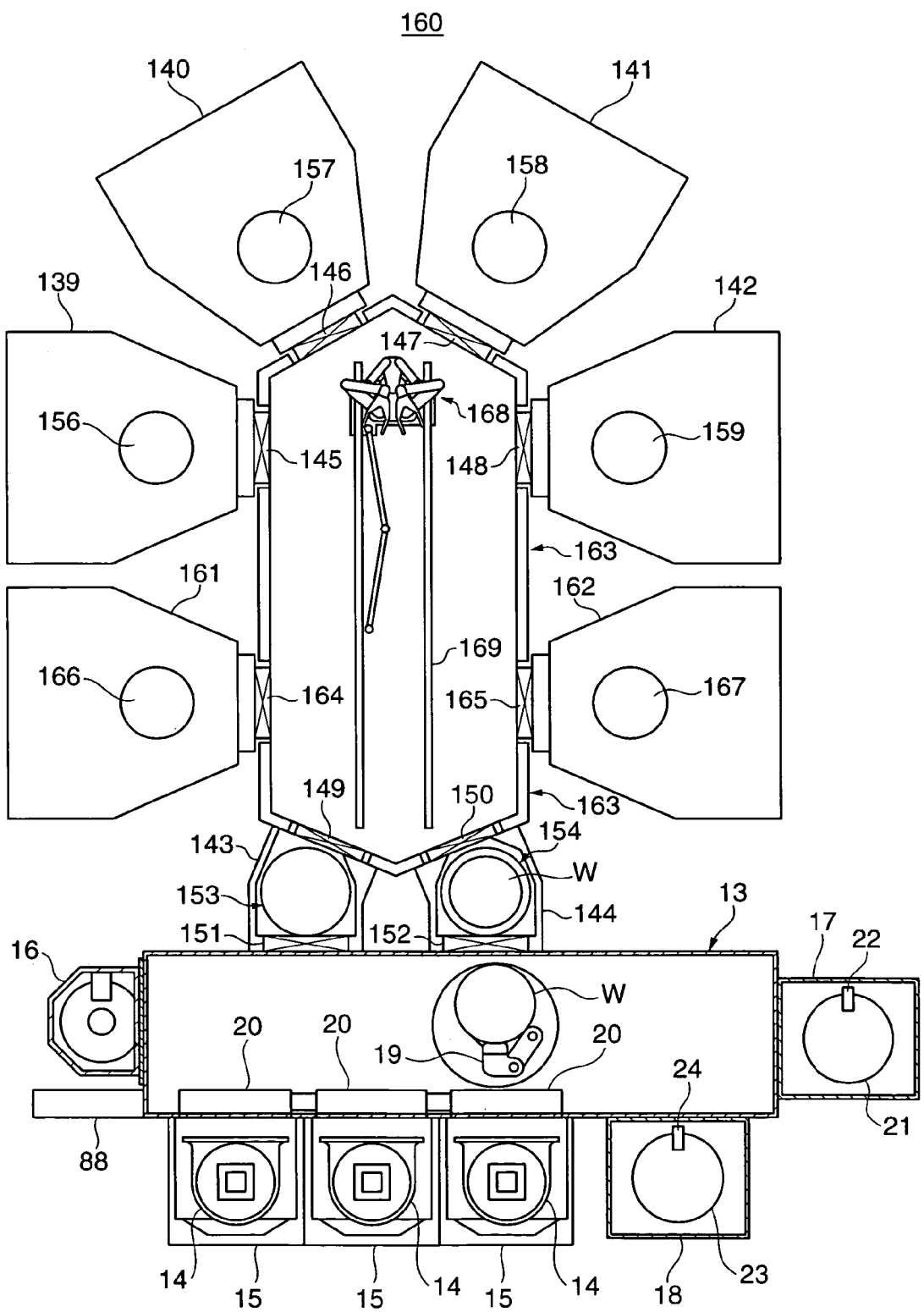
FIG. 11 is a plan view schematically showing the construction of a second variation of the substrate processing apparatus to which is applied the method of processing a substrate according to the above embodiment.

The substrate processing apparatus to which is applied the method of processing a substrate according to the present embodiment is not limited to being a substrate processing apparatus of a parallel type having two process ships arranged in parallel with one another as shown in FIG. 1, but rather as shown in FIGS. 10 and 11, the substrate processing apparatus may instead be one having a plurality of processing units arranged in a radial manner as vacuum processing chambers in which predetermined processing is carried out on the wafers W.

FIG. 10 is a plan view schematically showing the construction of a first variation of the substrate processing apparatus to which is applied the method of processing a substrate according to the present embodiment. In FIG. 10, component elements the same as ones of the substrate processing apparatus 10 shown in FIG. 1 are designated by the same reference numerals as in FIG. 1, and description thereof is omitted here.

As shown in FIG. 10, the substrate processing apparatus 137 is comprised of a transfer unit 138 having a hexagonal shape in plan view, four processing units 139 to 142 arranged in a radial manner around the transfer unit 138, a loader unit 13, and two load lock units 143 and 144 that are each disposed between the transfer unit 138 and the loader unit 13 so as to link the transfer unit 138 and the loader unit 13 together.

The internal pressure of the transfer unit 138 and each of the processing units 139 to 142 is held at vacuum. The transfer unit 138 is connected to the processing units 139 to 142 by vacuum gate valves 145 to 148 respectively.

In the substrate processing apparatus 137, the internal pressure of the loader unit 13 is held at atmospheric pressure, whereas the internal pressure of the transfer unit 138 is held at vacuum. The load lock units 143 and 144 are thus provided respectively with a vacuum gate valve 149 or 150 in a connecting part between that load lock unit and the transfer unit 138, and an atmospheric door valve 151 or 152 in a connecting part between that load lock unit and the loader unit 13, whereby the load lock units 143 and 144 are each constructed as a preliminary vacuum transfer chamber whose internal pressure can be adjusted. Moreover, the load lock units 143 and 144 have respectively therein a wafer mounting stage 153 or 154 for temporarily mounting a wafer W being transferred between the loader unit 13 and the transfer unit 138, respectively.

The transfer unit 138 has disposed therein a frog leg-type transfer arm 155 that can bend/elongate and turn. The transfer arm 155 transfers the wafers W between the processing units 139 to 142 and the load lock units 143 and 144.

The processing units 139 to 142 have respectively therein a mounting stage 156 to 159 on which is mounted a wafer W to be processed. Here, the processing unit 140 is constructed like the first processing unit 25 in the substrate processing apparatus 10, the processing unit 141 is constructed like the second processing unit 34 in the substrate processing apparatus 10, and the processing unit 142 is constructed like the third processing unit 36 in the substrate processing apparatus 10. Each of the wafers W can thus be subjected to RIE in the processing unit 140, the COR processing in the processing unit 141, and the PHT processing in the processing unit 142.

In the substrate processing apparatus 137, the method of processing a substrate according to the present embodiment is implemented by transferring a wafer W having thereon a low dielectric constant interlayer insulating film having a pseudo-$SiO_2$ layer formed on a surface thereof into the processing unit 141 and carrying out the COR processing, and then transferring the wafer W into the processing unit 142 and carrying out the PHT processing.

Operation of the component elements in the substrate processing apparatus 137 is controlled using a system controller constructed like the system controller in the substrate processing apparatus 10.

FIG. 11 is a plan view schematically showing the construction of a second variation of the substrate processing apparatus to which is applied the method of processing a substrate according to the present embodiment. In FIG. 11, component elements the same as ones of the substrate processing apparatus 10 shown in FIG. 1 or the substrate processing apparatus 137 shown in FIG. 10 are designated by the same reference numerals as in FIG. 1 or FIG. 10, and description thereof is omitted here.

As shown in FIG. 11, compared with the substrate processing apparatus 137 shown in FIG. 10, the substrate processing apparatus 160 has an additional two processing units 161 and 162, and the shape of a transfer unit 163 of the substrate processing apparatus 160 is accordingly different to the shape of the transfer unit 138 of the substrate processing apparatus 137. The additional two processing units 161 and 162 are respectively connected to the transfer unit 163 via a vacuum gate valve 164 or 165, and respectively have therein a wafer W mounting stage 166 or 167.

Moreover, the transfer unit 163 has therein a transfer arm unit 168 comprised of two SCARA-type transfer arms. The transfer arm unit 168 moves along guide rails 169 provided in the transfer unit 163, and transfers the wafers W between the processing units 139 to 142, 161 and 162, and the load lock units 143 and 144.

In the substrate processing apparatus 160, as for the substrate processing apparatus 137, the method of processing a substrate according to the present embodiment is implemented by transferring a wafer W having thereon a low dielectric constant interlayer insulating film having a pseudo-$SiO_2$ layer formed on a surface thereof into the processing unit 141 and carrying out the COR processing, and then transferring the wafer W into the processing unit 142 and carrying out the PHT processing.

Operation of the component elements in the substrate processing apparatus 160 is again controlled using a system controller constructed like the system controller in the substrate processing apparatus 10.

In the method of manufacturing an electronic device according to the present embodiment and each of the variations thereof described above, a pseudo-$SiO_2$ layer on a low dielectric constant interlayer insulating film is removed by the COR processing and PHT processing. However, the pseudo-$SiO_2$ layer subjected to the removal is not limited thereto. Rather, any film on which a pseudo-$SiO_2$ layer is formed can be subjected to the pseudo-$SiO_2$ layer removal by applying the COR processing and PHT processing.

For example, a photoresist film or a hard mask film using silicon oxide may also have the surface thereof damaged (altered) by RIE so that a pseudo-$SiO_2$ layer is formed. Such a pseudo-$SiO_2$ layer on a photoresist film or hard mask film can also be removed (subjected to ashing) using the COR processing and PHT processing as described above.

A description will now be given of a method of manufacturing an electronic device to which is applied a method of removing a pseudo-$SiO_2$ layer from a photoresist film by the COR processing and PHT processing.

First, a polysilicon layer is formed on a surface of a wafer W, and then an insulating film is formed on the polysilicon layer, and a release layer (silicon oxide) is further formed on the insulating film.

Next, a photoresist film is formed in a predetermined pattern on the release layer, and then the insulating film and the release layer are etched by RIE using a fluorocarbon ($C_4F_8$) gas or the like. At this time, a pseudo-$SiO_2$ layer is formed as an altered layer on the surface of the photoresist film, and pseudo-$SiO_2$ particles are also deposited as residue.

After that, the wafer W is housed in the chamber 38 of the second processing unit 34, and the surface of the photoresist film covered by the pseudo-$SiO_2$ layer is exposed to an atmosphere of a mixed gas comprised of ammonia gas, hydrogen fluoride gas and argon gas under a predetermined pressure, thus producing a product having a complex structure from the pseudo-$SiO_2$, the ammonia gas and the hydrogen fluoride gas on the surface of the photoresist film.

Next, the wafer W on which the product has been produced is mounted on the stage heater 51 in the chamber 50 of the third processing unit 36, and the surface of the photoresist film, and hence the product, is heated to a predetermined temperature, whereby the complex structure of the product is decomposed, the product being separated into silicon tetrafluoride, ammonia and hydrogen fluoride, which are vaporized. The pseudo-$SiO_2$ layer and pseudo-$SiO_2$ particles on the surface of the photoresist film are thus selectively removed (subjected to ashing).

According to the above method of manufacturing an electronic device, a pseudo-$SiO_2$ layer on the surface of a photoresist film can be selectively subjected to ashing without using a liquid chemical or plasma. Moreover, the amount produced of the product can be controlled through parameters of the mixed gas. Control of the amount removed of the pseudo-$SiO_2$ layer from the surface of the photoresist film can thus be carried out easily, and a decrease in wiring reliability in the electronic device can be prevented.

Examples of the electronic device include semiconductor devices, and also non-volatile or high-capacity memory devices having therein a thin film made of an insulating metal oxide material such as a ferroelectric material or a high dielectric material, in particular a material having a perovskite crystal structure. Examples of materials having a perovskite crystal structure include lead zirconate titanate (PZT), barium strontium titanate (BST), and strontium bismuth niobium tantalate (SBNT).

It is to be understood that the object of the present invention can also be attained by supplying to a system or apparatus (the EC 89) a storage medium in which a program code of software that realizes the functions of the above described embodiment is stored, and then causing a computer (or CPU, MPU, or the like) of the system or apparatus (EC 89) to read out and execute the program code stored in the storage medium.

In this case, the program code itself read out from the storage medium realizes the functions of the embodiment described above, and hence the program code and the storage medium in which the program code is stored constitute the present invention.

The storage medium for supplying the program code may be, for example, a floppy (registered trademark) disk, a hard disk, a magnetic-optical disk, a CD-ROM, a CD-R, a CD-RW, a DVD-ROM, a DVD-RAM, a DVD-RW, a DVD+RW, a magnetic tape, a non-volatile memory card, and a ROM. Alternatively, the program code may be downloaded via a network.

Moreover, it is to be understood that the functions of the above described embodiment may be accomplished not only by executing a program code read out by a computer, but also by causing an OS (operating system) or the like which operates on the computer to perform a part or all of the actual operations based on instructions of the program code.

Furthermore, it is to be understood that the functions of the above described embodiment may be accomplished by writing a program code read out from the storage medium into a memory provided on an expansion board inserted into a computer or in an expansion unit connected to the computer or in an expansion unit connected to the computer and then causing a CPU or the like provided on the expansion board or in the expansion unit to perform a part or all of the actual operations based on instructions of the program code.

The form of the program code may be, for example, object code, program code executed by an interpreter, or script data supplied to an OS.

What is claimed is:

1. A method of processing a substrate having a carbon-containing low dielectric constant insulating film thereon, the low dielectric constant insulating film having a surface damaged layer having a reduced carbon concentration lower than a carbon concentration of the low dielectric constant insulating film, the method removing the surface damage layer of the low dielectric constant insulating film and comprising:
    a surface damaged layer exposure step of exposing the surface damaged layer to an atmosphere of a mixed gas containing ammonia and hydrogen fluoride under a predetermined pressure; and
    a surface damaged layer heating step of heating to a predetermined temperature the surface damaged layer that has been exposed to the atmosphere of the mixed gas.

2. A method as claimed in claim 1, wherein in said surface damaged layer exposure step, the substrate is subjected to plasma-less etching.

3. A method as claimed in claim 1, wherein in said surface damaged layer exposure step, the substrate is subjected to dry cleaning.

4. A method as claimed in claim 1, wherein a volumetric flow rate ratio of the hydrogen fluoride to the ammonia in the mixed gas is in a range of 1 to ½, and the predetermined pressure is in a range of $6.7 \times 10^2$ to 4.0 Pa.

5. A method as claimed in claim 1, wherein the predetermined temperature is in a range of 80 to 200° C.

6. A method as claimed in claim 1, further comprising a product production condition deciding step of measuring a shape of the low dielectric constant insulating film having the surface damaged layer, and deciding at least one of the volumetric flow rate ratio of the hydrogen fluoride to the ammonia in the mixed gas and the predetermined pressure in accordance with the measured shape.

7. A method of processing a substrate having thereon a mask film comprising at least one of a photoresist film and a hard mask film, the mask film having a surface damaged layer, the method removing the surface damaged layer of the mask film and comprising:
    a surface damaged layer exposure step of exposing the surface damaged layer to an atmosphere of a mixed gas containing ammonia and hydrogen fluoride under a predetermined pressure; and
    a surface damaged layer heating step of heating to a predetermined temperature the surface damaged layer that has been exposed to the atmosphere of the mixed gas.

8. A method of manufacturing an electronic device, comprising:
    a low dielectric constant insulating film formation step of forming a carbon-containing low dielectric constant insulating film on a capacitor comprising a lower electrode, a capacitive insulating film and an upper electrode that has been formed on a semiconductor substrate;
    a photoresist layer formation step of forming a photoresist layer in a predetermined pattern on the formed low dielectric constant insulating film;
    a plasma fabrication step of fabricating a connecting hole reaching the upper electrode in the low dielectric constant insulating film by plasma processing using the formed photoresist layer;
    a connecting hole surface exposure step of exposing a surface of the fabricated connecting hole to an atmosphere of a mixed gas containing ammonia and hydrogen fluoride under a predetermined pressure; and
    a connecting hole surface heating step of heating to a predetermined temperature the surface of the connecting hole that has been exposed to the atmosphere of the mixed gas.

9. A method of manufacturing an electronic device, comprising:
    an interlayer insulating film formation step of forming a carbon-containing low dielectric constant insulating film on a semiconductor substrate, and forming an other insulating film having a lower carbon concentration than the low dielectric constant insulating film on the low dielectric constant insulating film, so as to form an interlayer insulating film;
    a plasma fabrication step of fabricating a wiring groove in the interlayer insulating film by plasma processing;
    a wiring groove surface exposure step of exposing at least a surface of the wiring groove at the low dielectric constant insulating film to an atmosphere of a mixed gas containing ammonia and hydrogen fluoride under a predetermined pressure;
    a wiring groove surface heating step of heating to a predetermined temperature the surface of the wiring groove that has been exposed to the atmosphere of the mixed gas; an other insulating film removal step of removing the other insulating film; and
    a wiring formation step of forming wiring by introducing a conductive material into the wiring groove.

10. A method as claimed in claim 9, further comprising:
    a photoresist layer formation step of forming a photoresist layer on the other insulating film; and
    an ashing step of removing the formed photoresist layer;
    wherein in said ashing step, the photoresist layer is exposed to an atmosphere of a mixed gas containing ammonia and hydrogen fluoride under a predetermined pressure, and then the photoresist layer that has been exposed to the atmosphere of the mixed gas is heated to a predetermined temperature.

11. A method of manufacturing an electronic device, comprising:
    a conductive film formation step of forming a silicon-containing conductive film on a semiconductor substrate;
    a low dielectric constant insulating film formation step of forming a carbon-containing low dielectric constant insulating film on the formed conductive film;

a photoresist layer formation step of forming a photoresist layer in a predetermined pattern on the formed low dielectric constant insulating film;

a plasma fabrication step of fabricating a connecting hole reaching the conductive film in the low dielectric constant insulating film by plasma processing using the formed photoresist layer;

a connecting hole surface exposure step of exposing a surface of the fabricated connecting hole to an atmosphere of a mixed gas containing ammonia and hydrogen fluoride under a predetermined pressure;

a connecting hole surface heating step of heating to a predetermined temperature the surface of the connecting hole that has been exposed to the atmosphere of the mixed gas;

an ashing step of removing the photoresist layer; and a wiring formation step of forming wiring by introducing a conductive material into the connecting hole.

12. A method of manufacturing an electronic device, comprising:

a conductive film formation step of forming a silicon-containing conductive film on a semiconductor substrate;

a low dielectric constant insulating film formation step of forming a silicon-containing low dielectric constant insulating film on the formed conductive film;

an anti-reflection film formation step of forming an anti-reflection film on the formed low dielectric constant insulating film;

a photoresist layer formation step of forming a photoresist layer having a pattern corresponding to a desired gate shape on the formed anti-reflection film;

an anti-reflection film removal step of removing partially the anti-reflection film through etching by using the formed photoresist layer to expose the low dielectric constant insulating film;

a low dielectric constant insulating film removal step of removing the exposed low dielectric constant insulating film by plasma processing using the formed photoresist layer to expose the conductive film;

a low dielectric constant insulating film side surfaces exposure step of exposing side surfaces of a part of the low dielectric constant insulating film below the photoresist layer, which has not been removed in said low dielectric constant insulating film removal step, to an atmosphere of a mixed gas containing ammonia and hydrogen fluoride under a predetermined pressure;

a low dielectric constant insulating film side surfaces heating step of heating to a predetermined temperature the side surfaces of the part of the low dielectric constant insulating film which has been exposed to the atmosphere of the mixed gas; and a conductive film removal step of removing through etching the conductive film not being covered with the part of the low dielectric constant insulating film which has not been removed.

* * * * *